United States Patent
Kim et al.

(10) Patent No.: US 11,049,574 B2
(45) Date of Patent: *Jun. 29, 2021

(54) NON-VOLATILE SEMICONDUCTOR MEMORY HAVING MULTIPLE EXTERNAL POWER SUPPLIES

(71) Applicant: Conversant Intellectual Property Management Inc., Ottawa (CA)

(72) Inventors: Jin-Ki Kim, Ottawa (CA); Peter B. Gillingham, Ottawa (CA)

(73) Assignee: Mosaid Technologies Inc., Ottawa (CA)

(*) Notice: Subject to any disclaimer, the term of this patent is extended or adjusted under 35 U.S.C. 154(b) by 0 days.

This patent is subject to a terminal disclaimer.

(21) Appl. No.: 16/886,977

(22) Filed: May 29, 2020

(65) Prior Publication Data

US 2020/0357477 A1   Nov. 12, 2020

Related U.S. Application Data

(63) Continuation of application No. 16/221,824, filed on Dec. 17, 2018, now Pat. No. 10,706,943, which is a
(Continued)

(51) Int. Cl.
*G11C 16/30* (2006.01)
*G11C 5/14* (2006.01)
(Continued)

(52) U.S. Cl.
CPC .......... *G11C 16/30* (2013.01); *G11C 5/14* (2013.01); *G11C 5/143* (2013.01); *G11C 5/145* (2013.01); *G11C 16/10* (2013.01); *G11C 16/12* (2013.01); *G11C 16/14* (2013.01); *G11C 16/26* (2013.01); *G11C 16/0483* (2013.01); *G11C 16/08* (2013.01)

(58) Field of Classification Search
None
See application file for complete search history.

(56) References Cited

U.S. PATENT DOCUMENTS 5,655,125 A * 8/1997 Cloud ................... G06F 1/3203
                                                        713/300
6,011,287 A   1/2000 Yasuo et al.
(Continued)

FOREIGN PATENT DOCUMENTS

WO           01/75892 A2    10/2001

*Primary Examiner* — Tan T. Nguyen
(74) *Attorney, Agent, or Firm* — Conversant IP Management Corp.

(57) ABSTRACT

A memory device includes core memory such as flash memory for storing data. The memory device includes a first power input to receive a first voltage used to power the flash memory. Additionally, the memory device includes a second power input to receive a second voltage. The memory device includes power management circuitry configured to receive the second voltage and derive one or more internal voltages. The power management circuitry supplies or conveys the internal voltages to the flash memory. The different internal voltages generated by the power management circuitry (e.g., voltage converter circuit) and supplied to the core memory enable operations such as read/program/erase with respect to cells in the core memory.

13 Claims, 19 Drawing Sheets

Related U.S. Application Data continuation of application No. 15/597,603, filed on May 17, 2017, now Pat. No. 10,199,113, which is a continuation of application No. 15/401,858, filed on Jan. 9, 2017, now Pat. No. 9,928,918, which is a continuation of application No. 14/969,351, filed on Dec. 15, 2015, now Pat. No. 9,576,675, which is a continuation of application No. 14/107,735, filed on Dec. 16, 2013, now Pat. No. 9,245,640, which is a continuation of application No. 13/649,403, filed on Oct. 11, 2012, now Pat. No. 8,619,473, which is a continuation of application No. 13/096,874, filed on Apr. 28, 2011, now Pat. No. 8,300,471, which is a continuation of application No. 12/617,459, filed on Nov. 12, 2009, now Pat. No. 8,194,456, which is a continuation of application No. 11/955,754, filed on Dec. 13, 2007, now Pat. No. 7,639,540.

(60) Provisional application No. 60/949,993, filed on Jul. 16, 2007, provisional application No. 60/902,003, filed on Feb. 16, 2007.

(51) Int. Cl.
*G11C 16/10* (2006.01)
*G11C 16/12* (2006.01)
*G11C 16/14* (2006.01)
*G11C 16/26* (2006.01)
G11C 16/04 (2006.01)
G11C 16/08 (2006.01)

(56) References Cited

U.S. PATENT DOCUMENTS

| | | |
|---|---|---|
| 7,916,518 B2* | 3/2011 | Yamada ............... G11C 5/147 |
| | | 365/154 |
| 9,928,918 B2* | 3/2018 | Kim ..................... G11C 5/14 |
| 2007/0055854 A1 | 3/2007 | Chang et al. |
| 2020/0028468 A1* | 1/2020 | Kano ..................... H03B 5/04 |

* cited by examiner

NON-VOLATILE SEMICONDUCTOR MEMORY HAVING MULTIPLE EXTERNAL POWER SUPPLIES

RELATED APPLICATIONS

This Patent Application is a Continuation of U.S. patent application Ser. No. 16/221,824 filed Dec. 17, 2018, which is a continuation of U.S. patent application Ser. No. 15/597,603 filed May 17, 2017 (now U.S. Pat. No. 10,199,113), which is a Continuation of U.S. patent application Ser. No. 15/401,858 (now U.S. Pat. No. 9,928,918) filed Jan. 9, 2017, which is a Continuation of U.S. patent application Ser. No. 14/969,351 (now U.S. Pat. No. 9,576,675) filed Dec. 15, 2015, which is a Continuation of U.S. patent application Ser. No. 14/107,735 filed Dec. 16, 2013 (now U.S. Pat. No. 9,245,640), which is a Continuation of U.S. patent application Ser. No. 13/649,403 (now U.S. Pat. No. 8,619,473) filed on Oct. 11, 2012, which is a Continuation of U.S. patent application Ser. No. 13/096,874 (now U.S. Pat. No. 8,300,471) filed on Apr. 28, 2011, which is a Continuation of U.S. patent application Ser. No. 12/617,459 (now U.S. Pat. No. 8,194,456) filed on Nov. 12, 2009, which is a Continuation of U.S. patent application Ser. No. 11/955,754 (now U.S. Pat. No. 7,639,540) filed on Dec. 13, 2007, which is related to and claims the benefit of earlier filed: i) U.S. Provisional Patent Application Ser. No. 60/949,993, filed on Jul. 16, 2007, and ii) U.S. Provisional Patent Application Ser. No. 60/902,003 filed on Feb. 16, 2007; the contents and teachings of which are hereby incorporated by reference in their entireties.

BACKGROUND

Today, many electronic devices include memory systems to store information. For example, some memory systems store digitized audio or video information for playback by a respective media player. Other memory systems store software and related information to carry out different types of processing functions.

In many of the electronic devices, the memory systems often comprise a controller and one or more corresponding flash memory devices. The controller typically includes circuitry configured to generate signals to the memory devices for storage and retrieval of data from the flash memory devices.

Conventional flash memory devices typically include a single power input pin to receive power from an external power source. The power is usually received at a selected voltage level such as 3.3 volts. Because access and programming operations associated with flash memory require different voltages, flash memory devices are typically configured to include one or more power voltage converters to produce any internal voltages that are necessary to operate the flash memory device. For example, conventional flash memory devices typically include power converter circuitry to convert a 3.3 volt input to other internally used voltages such as 5 volts, 7 volts, 12 volts, etc.

BRIEF DESCRIPTION OF THE DRAWINGS

Reference will now be made, by way of example, to the accompanying drawings of which.

DETAILED DESCRIPTION OF ILLUSTRATED EMBODIMENTS

Figure 1:
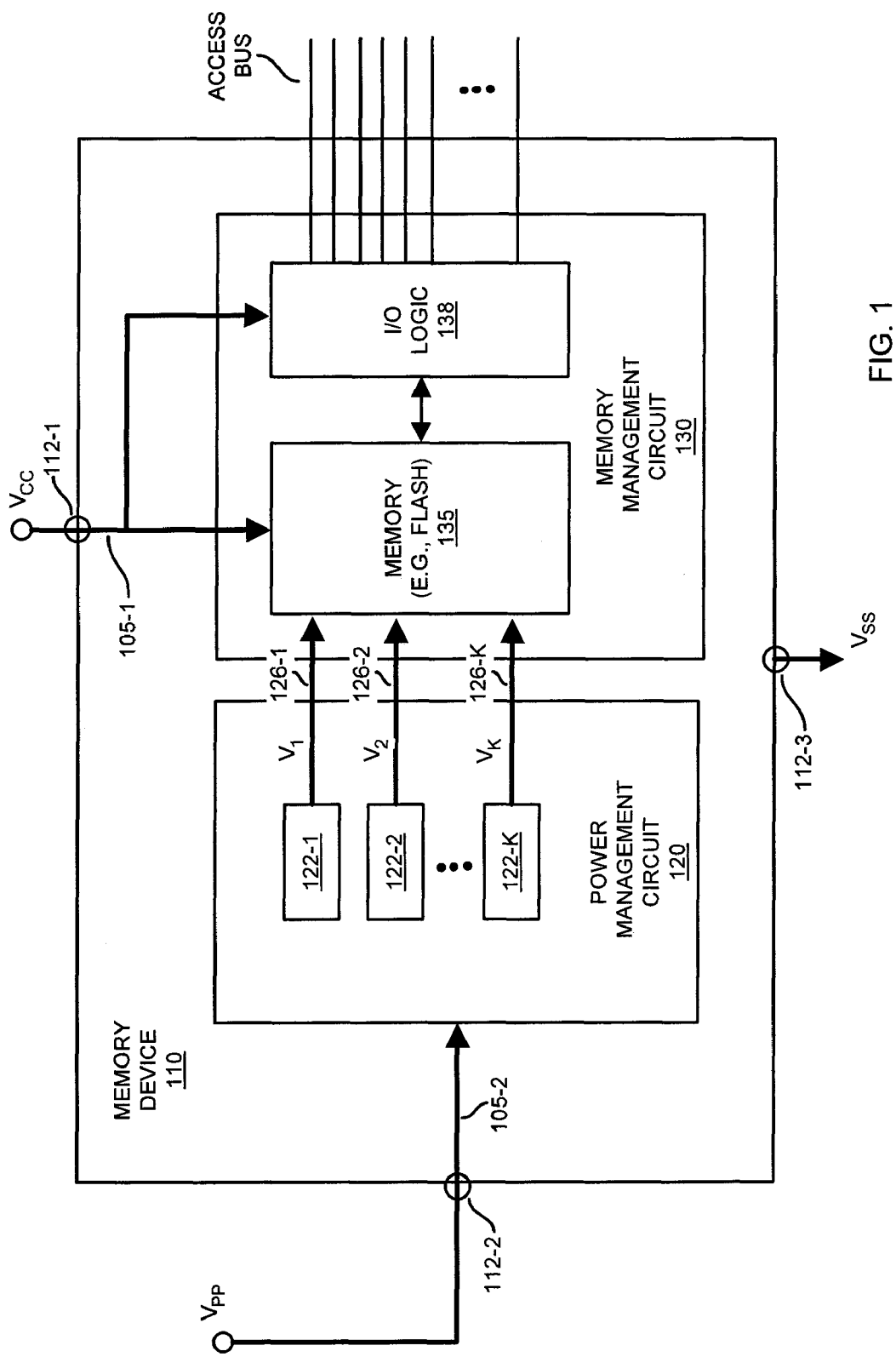
FIG. 1 is an example diagram of a memory device including multiple power inputs according to embodiments herein.

There are certain drawbacks associated with producing internal power signals in conventional memory devices. For example, as discussed above, conventional memory devices now use a single primary input voltage such as 3.3 volts to power flash memory in the memory device. Internally, the 3.3 volt input is converted into multiple higher voltage levels that are used for operations such as reading data from the flash memory, programming the flash memory, erasing the flash memory, etc.

To convert the primary input voltage to the higher voltages, conventional memory devices typically include one or more so-called charge pump circuits. During operation, each of the one or more charge pumps converts the primary input voltage (i.e., 3.3 volts) to a specified higher voltage level for use by the flash memory to carry out different memory operations.

In general, conversion efficiency of the charge pumps is exponentially worse for larger differences between the input voltage and a generated output voltage. For example, conversion efficiency is lower for a charge pump that converts a 3.3 volt input to a 20 volt output than a charge pump that converts a 3.3 volt input to a 7 volt output.

There is currently a trend to produce circuit devices that operate at yet lower and lower voltages. For example, older technology required a 5 volt source to operate core memory of a corresponding memory device. As mentioned above, conventional flash memory device technology currently requires a 3.3 volt power source to power corresponding core memory. It is expected that future memory devices will operate on a power source such as a 1.8 volt input or even less. Currently, the high voltages required to perform memory operations with respect to the core memory do not scale down with the voltage required to power the core memory. In other words, even though a core memory operates at a lower voltage such as 1.8 voltage, the core memory may still require a range of voltages between 5 and 20 volts to perform memory operations.

Configuring a core flash memory to operate at a low voltage such as 1.8 volts (or even lower) lowers the amount of power expended to power the core memory device. However, converting this low or lower voltage input (e.g., 1.8 volts) to the same range of higher voltages such as between 5 and 20 volts to enable memory operations will have the ill-effect of reducing converter efficiency, increasing a size and complexity of respective charge pump circuitry required to convert the 1.8 volts into the range of higher voltage, and/or reduce read/program/erase performance of the memory device.

In general, embodiments herein include a memory device and/or memory system that overcomes the deficiencies as discussed above and/or other deficiencies known in the art. For example, according to embodiments herein, a memory device includes core memory such as flash memory for storing data. The memory device includes a first power input to receive a first voltage used to at least power the core memory (e.g., flash memory). Additionally, the memory device includes a second power input to receive a second voltage. Power management circuitry (e.g., one or more voltage converter circuits) in the memory device receives the second voltage and derives one or more internal voltages that are conveyed to the flash memory.

Thus, embodiments herein include a memory device that is configured with appropriate inputs (e.g., power input pins, pads, conductive pathways, etc.) to receive, not just a single voltage, but multiple different voltages (e.g., a first voltage, second voltage, third voltage, etc.) for powering and operating the memory device.

According to one embodiment, the first voltage powers the flash memory (e.g., core memory) in the memory device while the second voltage power is 'up' or 'down' converted to one or more input voltages that are conveyed (e.g., supplied) to the flash memory to support operations such as: i) programming of cells in the flash memory, ii) erasing of cells in the flash memory, iii) reading data from cells in the flash memory, and iv) programming data to cells of the flash memory. That is, the received second voltage can be 'down' converted to a set of one or more lower voltages used to carry out operations with respect to the core memory. Additionally, or as an alternative, the second voltage can be 'up' converted to a set of one or more higher voltages used to carry out operations with respect to the core memory.

To convert the second voltage into higher voltages, the power management circuitry (e.g., power converter circuitry) can include one or more charge pump circuits that convert the second voltage into one or more voltages that are greater than the second voltage. For example, the first voltage may be 1.8 volts or 3.3 volts; the second voltage may be on the order of 5 volts or more, although these voltages will vary depending on the application. The power management circuitry receives and converts the second voltage (e.g., 5 volts) into a range of different voltage levels such as 7 volts, 10 volts, 18 volts and/or 20 volts. Note again that these internally generated voltages can be supplied to the flash memory to support different types of data access operations with respect to the flash memory in the memory device.

In further example embodiments, the power management circuitry in the memory device includes one or more charge pump circuits. For example, the power management circuitry can include first charge pump circuitry to convert the second voltage to a first internal voltage (e.g., 7 volts) that is higher than the second voltage (e.g., 5 volts) as well as second charge pump circuitry to convert the second voltage (e.g., 5 volts) to a second internal voltage (e.g., 10 volts) that is higher than the first internal voltage (e.g., 7 volts).

As mentioned above, the first internal voltage and the second internal voltage can be used to support different data access operations with respect to the flash memory. For example, first internal voltage may be a 7 volt signal used to support read operations with respect to data stored in storage cells of the flash memory; the second internal voltage may be a 20 volt signal that supports erase operations with respect to storage cells in the flash memory, and so on. More specific use of the different generated voltages will be discussed later in this specification.

In yet further example embodiments, the memory device can include a substrate (e.g., a semiconductor substrate, circuit board, etc.) on which one or both the power management circuitry (e.g., voltage converter circuitry) and the flash memory reside.

The memory device and/or substrate can include a respective first conductive pad or power input pin for receiving the first voltage from a first power source external to the memory device. The memory device and/or substrate can include a second conductive pad or power input pin for receiving the second voltage from a second power source external to the memory device. Thus, in lieu of receiving only a single voltage as in conventional applications, embodiments herein support reception and use of power received from multiple external power supplies.

To support conveyance of the first and second voltages to appropriate embodiments discussed herein, the substrate (e.g., the semiconductor substrate) can include i) a first conductive path to convey the first voltage to the flash memory, and ii) a second conductive path to convey the second voltage to the power management circuitry. Additionally, the substrate can include a number of conductive paths to convey the voltages generated by the power management circuitry to the flash memory.

Note further that the memory device as described herein can be configured to sense a presence or magnitude of one or more input voltages and automatically select an appropriate input voltage for generating the one or more internal voltages used to operate the flash memory. For example, the memory device can include detector circuitry to monitor the second voltage. During times when the second voltage is below a threshold value, the detector circuitry can generate a signal notifying or controlling the power management circuitry to derive the one or more internally generated voltages (e.g., the internal voltages in the memory device generated by the power management circuitry) based on the first voltage rather than the second voltage. During times when the second voltage is above a threshold value, the detector circuitry can generate a signal notifying the power management circuitry to derive the at least one internal voltage (e.g., the internal voltages in the memory device generated by the power management circuitry) based on the second voltage rather than the first voltage. Accordingly, the power management circuitry generates internal voltages based on a selected one of multiple input voltages according to embodiments herein.

Additional embodiments support electrical selection by control register or logic input of a particular external voltage to be used to produce the internal voltages.

These and other embodiments will be discussed in more detail later in this specification.

As discussed above, techniques herein are well suited for use in memory devices and systems such as those supporting use of flash technology, electrically erasable semiconductor memory, non-volatile memory, etc. However, it should be noted that embodiments herein are not limited to use in such applications and that the techniques discussed herein are well suited for other applications as well.

Additionally, although each of the different features, techniques, configurations, etc. herein may be discussed in different places of this disclosure, it is generally intended that each of the concepts can be executed independently of each other or in combination with each other where feasible. Accordingly, at least some example embodiments of the invention can be embodied and viewed in many different ways.

Now, more particularly, FIG. 1 is an example diagram illustrating a memory device 110 according to embodiments herein.

In the context of the present example, memory device 110 includes inputs 112 (e.g., input 112-1, input 112-2, and input 112-3), power management circuitry 120, and memory management circuitry 130. Power management circuitry 120 includes a set of one or more voltage converter circuits 122 (e.g., voltage converter circuitry such as voltage converter circuit 122-1, voltage converter circuit 122-2, . . . , voltage converter circuit 122-K) to convert the input voltage Vpp (e.g., second voltage) to internal voltages V1, V2, . . . , Vk. Memory management circuitry 130 includes memory 135 (e.g., non-volatile semiconductor memory such as flash memory) for storing data.

Memory management circuitry 130 also includes I/O logic and related circuitry for accessing memory 135.

During operation, input 112-1 (e.g., one or more power input pins, pads, conductive pathways, etc.) of memory device 110 receives first voltage (e.g., Vcc), which is used to at least power the flash memory 135. Vcc can be used to power other circuits such as I/O logic 138 and related circuitry supporting access to memory 135.

Note that in alternative embodiments, memory device 110 can include yet another voltage input for powering portions of I/O logic 138. Thus, memory device 110 is not limited to receiving only two different input power supply voltages.

In the context of the present example, voltage Vss represents one or more ground signals providing one or more corresponding return path(s) for first voltage Vcc and/or second voltage Vpp. The return paths are not considered to be power inputs. Additionally, input 112-2 (e.g., one or more power input pins, pads, conductive pathways, etc.) of memory device 110 receives a second voltage (e.g., Vpp), which is supplied or conveyed to the power management circuitry 120. In one embodiment, Vpp is greater than Vcc.

Input 112-3 of memory device 110 receives ground (e.g., one or more return paths) or voltage Vss.

Thus, as shown in FIG. 1, memory device 110 includes different inputs 112 to receive voltages from multiple external power sources. For example, a first power source supplies voltage Vcc to memory device 110; a second power source supplies Vpp to memory device 110. Note that other embodiments can include yet additional power inputs as mentioned above.

As shown, the memory device 110 and corresponding substrate in the memory device 110 can include i) a conductive path 105-1 to convey the first voltage Vcc to the flash memory 135 and related circuitry in memory management circuitry 130, and ii) a conductive path 105-2 to convey the second voltage Vpp to the power management circuitry 120.

Additionally, note that memory device 110 and corresponding substrate (on which the power management circuitry 120 and memory management circuitry 130 resides) can include a number of conductive paths (e.g., conductive path 126-1, conductive path 126-2, . . . , conductive path 126-K) to convey the internal voltages V1, V2, . . . , Vk generated by the power management circuitry 120 to the flash memory 135.

Thus, via conductive paths 105-2, power management circuitry 130 of the memory device 110 receives voltage Vpp (e.g., a first external power supply). Based on Vpp, power management circuitry 120 derives one or more internal voltages V1, V2, . . . , Vk that are conveyed (via conductive paths 126 in the memory device 110) to the memory 135 to support memory operations.

In an example embodiment, the power management circuitry 120 receives and converts the second voltage Vpp (e.g., 5 volts) into different voltage levels such as V1=7 volts (e.g., supporting read operations), V2=10 volts (e.g., supporting pass operations), . . . , Vk−1=18 volts (e.g., supporting programming operations), and Vk=20 volts (e.g., supporting erase operations). As mentioned above, the one or more internally generated voltages V1, V2, . . . , Vk are conveyed (e.g., supplied) to the memory 135 to support operations such as: i) programming of cells in the flash memory, ii) erasing of cells in the memory 135, iii) reading data from cells in the memory 135.

Note again that the above voltages are merely examples and the actual voltages produced by power management circuitry 120 can vary depending on the application.

To convert Vpp into internal voltages V1, V2, . . . , Vk, the power management circuitry 120 includes voltage converter circuitry 122 such as, for example, one or more charge pump circuits.

In general, one type of charge pump is an electronic circuit that uses multiple stages of capacitors as energy storage elements to create either a higher or lower voltages. Charge pumps use some form of switching device(s) to control the connection of voltages to the capacitor. In one embodiment, the voltage converter circuitry 122 includes Dickson type charge pumps as shown and discussed with respect to FIG. 6.

Note that charge pumping action typically operates in the kilohertz to megahertz range, although the actual operating frequency varies depending on the application. Also, in addition to producing higher or lower voltages, it should be noted that charge pumps can be configured to invert voltages as well as produce fractional voltage outputs depending on the controller and circuit topology in power management circuitry 120.

Still referring to FIG. 1, when used to produce internal voltages V1, V2, . . . , Vk, charge pumps are typically more efficient at producing higher voltages when the difference between the input voltage and output voltage is smaller. In other words, as discussed above, conversion efficiency is lower for a charge pump that converts a 3.3 volt input to a 20 volt output than a charge pump that converts a 5 volt input to a 20 volt output. Thus, as described herein, generating internal voltages V1, V2, . . . , Vk based on a higher input voltage Vpp (rather than Vcc) increases power conversion efficiency of the power management circuitry 120.

Accordingly, at the expense of adding another voltage input (e.g., Vpp) to the memory device 110 as described herein, the size and complexity of the power management circuitry 120 can be reduced but yet still provide appropriate voltages to perform different memory operations. More specifically, use of Vpp to power the power management circuitry 120 (instead of Vcc) and produce internal voltages V1, V2, . . . , Vk can reduce a number of stages in a charge pump that are required to produce the same output voltage. For example, to convert a 3.3 volt input to 20 volts may require a 24-stage charge pump while conversion of a 5 volt input to 20 volts may require only a 10-stage charge pump. Thus, embodiments herein reduce a size and complexity of corresponding voltage converter circuitry used to produce the internal voltages V1, V2, . . . , Vk.

To carry out embodiments as described herein, the memory device 110 can include a substrate (e.g., a semiconductor substrate, printed circuit board, flexible circuit board, etc.) on which one or both the power management circuitry 120 and the flash memory 135 resides. The memory device 110 and/or substrate can include a respective conductive pad or power input pin for receiving the first voltage from a first power source external to the memory device as well as a second conductive pad or power input pin for receiving the second voltage from a second power source external to the memory device.

As example voltage ranges, input 112-1 can support receiving voltage Vcc such as a voltage between 1.5 and 3.5 volts depending on power requirements associated with memory 135. Input 112-2 can be configured to support reception of a higher input voltage Vpp (e.g., Vpp can be greater than Vcc as previously discussed).

Note again that the above discussion of example voltage values and ranges is for illustrative purposes only and that the actual value of input voltages (e.g., Vpp and Vcc) can vary depending on the application.

Based on the above discussion, embodiments herein include a memory device 110 configured to overcome the deficiencies as discussed above and/or other deficiencies known in the art. For example, according to embodiments herein, memory device 110 includes memory 135 for storing data. In lieu of powering both the memory 135 and the voltage converter circuitry 122 with the same input voltage (e.g., Vcc) received on input 112-1, memory device 110 includes additional input 112-2 for receiving voltage Vpp.

In summary, use of separate and/or higher input voltage Vpp to generate internal voltages V1, V2, . . . , Vk for operating memory functions (e.g., reading, programming, erasing, . . . ) provides advantages over conventional memory devices as mentioned above. For example, the power management circuitry 120 and corresponding voltage converter circuitry 122 are more efficient at generating internal voltages V1, V2, . . . , Vk based on a higher input voltage than is used to power the memory 135. In other words, the memory 135 and/or I/O logic 138 can operate on a relatively low voltage Vcc; power management circuitry 120 and corresponding voltage converter circuitry 122 can operate on a higher voltage. Use of the higher input voltage Vpp increases converter efficiency (e.g., reduces power consumption) and thus reduces the size and complexity of a respective converter circuitry (e.g., a charge pump circuit) required to produce internal voltages V1, V2, . . . , Vk.

Use of higher voltage Vpp (as opposed to using Vcc) can also increase read/program/erase performance with respect to memory 135 of the memory device 110 because it is easier to generate higher internal voltages V1, V2, . . . , Vk needed to more quickly carry out memory operations with respect to memory 135. That is, generation of higher internal voltages V1, V2, . . . , Vk supports faster read/program/erase operations. When power management circuitry 120 generates internal voltages V1, V2, . . . , Vk based on input voltage Vcc (rather than Vpp), internal voltages V1, V2, . . . , Vk are proportionally reduced, decreasing the overall performance of carrying out memory operations. In other words, in circumstances where an extra voltage input such as Vpp is not available in a corresponding memory system, the memory device 110 can receive voltage Vcc on input 112-2, produce lower internal voltages V1, V2, . . . , Vk, and yet still operate, but at slower read/program/erase speeds. Most applications, however, will benefit from another voltage such as Vpp for providing power to the power management circuitry 120.

Figure 2:
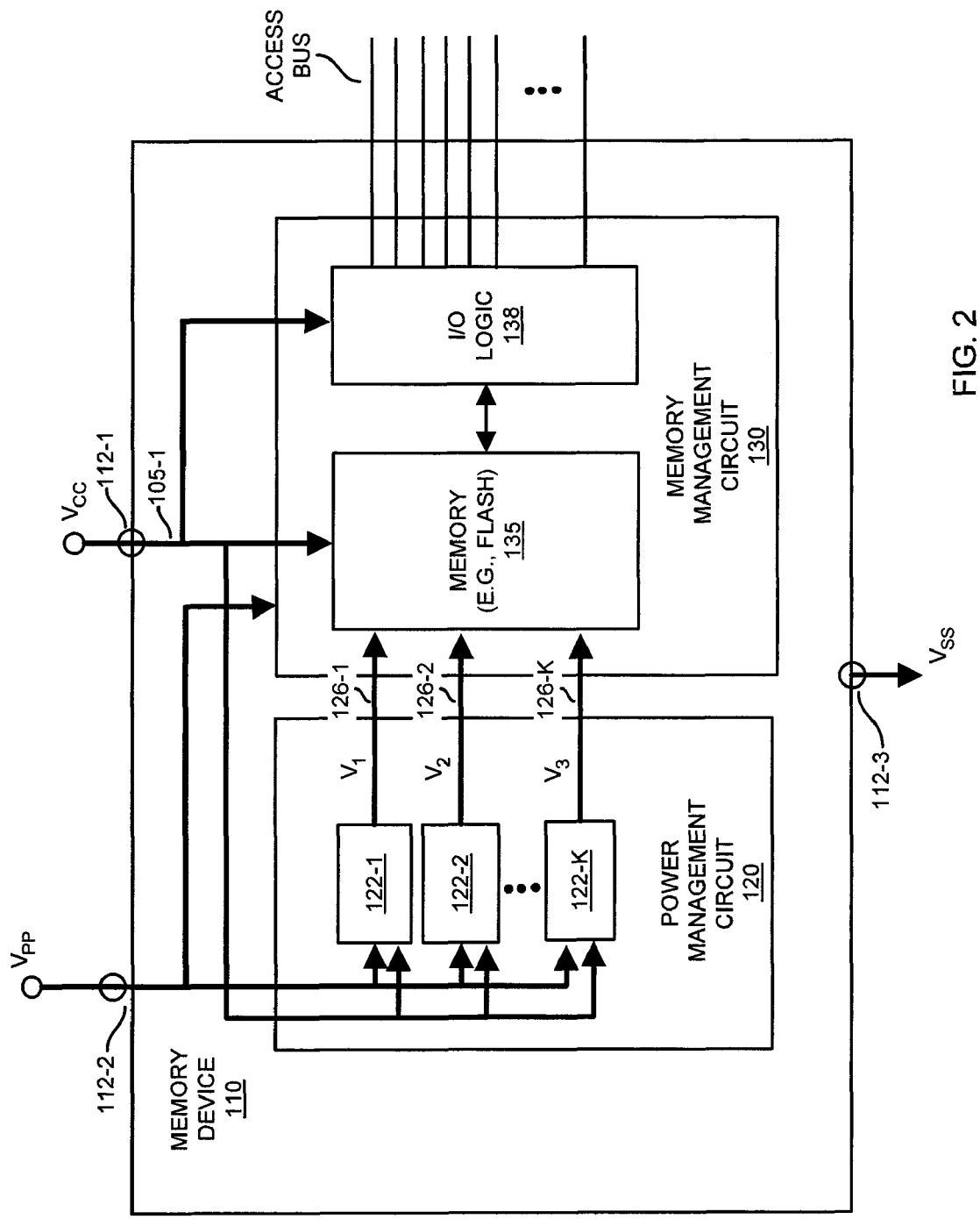
FIG. 2 is an example diagram of a memory device including multiple power inputs and cross-sharing of voltages according to embodiments herein.

FIG. 2 is an example diagram of a memory device 110 including multiple power inputs according to embodiments herein. Generally, the memory device 110 in FIG. 2 supports the same operations as discussed above with respect to FIG. 1. However, the memory device 110 in FIG. 2 illustrates that Vpp can be used as the first power source for the power management circuitry 120 and that Vcc is the first power source for the memory core (e.g., memory 135) as well as corresponding control and I/O logic 138. However, additionally, as shown in FIG. 2, Vcc may be used in some portions of the internal power management circuitry 120 to support functions such as a reference generator, master oscillator, clock driver, etc. Note also that Vpp may be used in some portions of the memory 135 to perform functions such as a local charge pump in row decoders and row pre-decoders.

Figure 3:
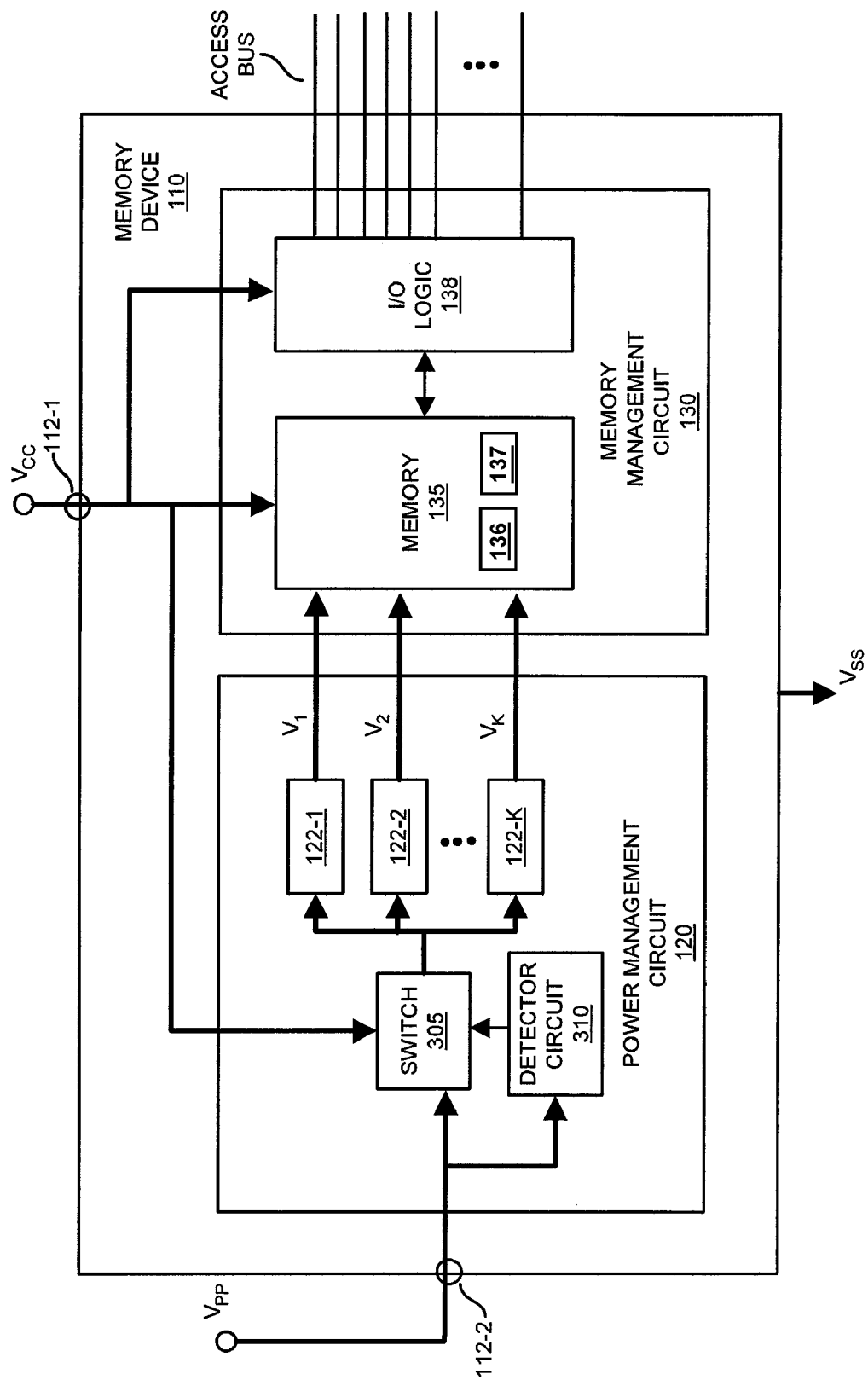
FIG. 3 is an example diagram of a memory device including detector circuitry for selecting an input power source for creating internal voltages according to embodiments herein.

FIG. 3 is an example diagram of a memory device including detector circuitry for selecting input power and creating internal voltages according to embodiments herein. In such an embodiment, the memory device 110 as described herein can be configured to sense a presence or magnitude of one or more input voltages and automatically select an appropriate input voltage for generating the one or more internal voltages used to operate the memory 135. In other words, a user or manufacturer can include the memory device 110 in a corresponding memory system and apply both Vcc and Vpp to the device during operation. In this instance, as discussed above, the power management circuitry 120 produces internal voltages V1, V2, . . . , Vk based on input voltage Vpp. According to another instance, if voltage Vpp fails or the user or manufacturer connects Vpp to ground (or leaves it as an open circuit), the detector circuitry 310 (via switch 305) can detect such a condition and convey voltage Vcc (in lieu of voltage Vpp) to the input of voltage converter circuitry 122 to produce respective internal voltages V1, V2, . . . , Vk. Thus, voltage Vcc can be used as a backup for generating the internal voltages V1, V2, . . . , Vk when Vpp is not available.

In one embodiment, the example pump as shown can be designed to operate based on lower voltages. However, if a higher voltage and is used to operate the voltage converter circuitry 122 (e.g., a charge pump circuit), the pump is faster and shuts off sooner.

One way that the detector circuitry 310 can determine whether to automatically select the input voltage Vcc or input voltage Vpp is to compare the voltage at input 112-2 to a threshold reference value. If the voltage at input 112-2 is greater than the threshold value, the detector circuitry 310 controls switch 305 to convey the voltage at the input 112-2 to the voltage converter circuitry 122. If the voltage at input 112-2 is less than the threshold value, the detector circuitry 310 controls switch 305 to convey voltage at input 112-1 to voltage converter circuits 122.

Another way that detector circuitry 310 can determine whether to automatically select voltage Vcc or voltage Vpp is to compare the voltage at input 112-2 to the voltage at input 112-1. If the voltage at input 112-2 is greater than the voltage at input 112-1, the detector circuitry 310 controls switch 305 to convey voltage Vpp to voltage converter circuits 122. If the voltage at input 112-2 is less than the voltage at input 112-1, the detector circuitry 310 controls switch 305 to convey voltage Vcc to voltage converter circuitry 122 to produce internal voltages V1, V2, . . . , Vk. Accordingly, the detector circuitry 310 of power management circuitry 120 can generate internal voltages V1, V2, . . . , Vk based on a status of multiple input voltages.

In one embodiment, if the input voltages are equal, the memory device 110 can operate as discussed above and as shown in FIG. 2.

Based on the different operational modes as discussed above, switching the mode between Single Power Supply Mode (e.g., Vcc is used to power the power management circuitry 120 and the memory management circuitry) and Multiple Power Supply Mode (e.g., using Vcc and Vpp as in FIG. 1) can occur automatically by detecting the voltage level or health of Vpp using, for example, a comparator that compares the level on the Vpp pin with the Vcc supply voltage. Thus, if a user has connected the Vpp pin to ground (0V), the memory will use the Vcc supply to supply the internal high voltage pumps. If the user has connected Vpp to a proper voltage (5~12V), the memory can use the Vpp supply to power the pumps for higher efficiency operation.

In yet further embodiments, the memory management circuitry 130 of memory device 110 can include a control register 137 for manually or electronically selecting (e.g., via configuration commands) a so-called single power supply mode in which the power management circuitry 120 generates internal voltages V1, V2, . . . , Vk based on Vcc or a so-called dual mode in which the power management circuitry generates internal voltages V1, V2, . . . , Vk based on Vpp while memory 135 is powered by Vcc.

More specifically, as an alternative of in addition to use of the detector circuitry 310 and switch 305 to switch between different power supply modes, the memory management circuitry 130 can include a configuration register (e.g., a device control configuration register) to selectively switch between Single Power Supply Mode and Multiple Power Supply Mode based on software commands. An example memory device including registers is described in U.S. provisional patent application Ser. No. 60/902,003, filed Feb. 16, 2007 and entitled "Non-volatile Memory System," the entire teachings of which are incorporated herein by this reference. Several additions to the registers as described below enable flexible use of multiple external power sources. A digital controller device (internal or external to the memory device) can be configured to write to the control register 137 and select which mode shall be used to operate memory device 110 as in table 1 below. In order to select Vcc as a source for producing internal voltages V1, V2, . . . , Vk, a controller associated with the memory device 110 writes a logic 0 to bit 0 of the device control register 137 in table 1 below. In order to select Vpp as a source for producing internal voltages V1, V2, . . . , Vk, a controller writes a logic 1 to bit 0 of the device control register 137 in table 1 below.

TABLE 1

Device Control Register

| Description | Bit 7 | Bit 6 | Bit 5 | Bit 4 | Bit 3 | Bit 2 | Bit 1 | Bit 0 |
|---|---|---|---|---|---|---|---|---|
| Use Vcc | X | X | X | X | X | X | X | 0 |
| Use Vpp | X | X | X | X | X | X | X | 1 |

In accordance with some example embodiments, the Read Device Information Register 136 (as in table 2 below) in the flash memory device 135 may provide information with respect to possible configurations of memory device 110 based on bits 6 and 7. For example, when bit 6 and 7 are logic '0', this indicates that the given memory device 110 uses input voltage Vcc to generate the internal voltages. When bit 6 is '0' and bit 7 is '1', this indicates that the given memory device uses input voltage Vpp to generate the internal voltages. Lastly, when bit 6 is '1' and bit 7 is '0', this indicates that the given memory device 110 can be configured by a controller to use input voltage Vpp or input voltage Vcc to generate the internal voltages. Thus, the device configuration register can be used to indicate what powering options are supported by the memory device 110.

TABLE 2

Device Configuration Register

| Description | | Bit 7 | Bit 6 | Bit 5 | Bit 4 | Bit 3 | Bit 2 | Bit 1 | Bit 0 |
|---|---|---|---|---|---|---|---|---|---|
| Cell Type | 2 Level Cell | | | | | | | 0 | 0 |
| | 4 Level Cell | | | | | | | 0 | 1 |
| | 8 Level Cell | | | | | | | 1 | 0 |
| | 16 Level Cell | | | | | | | 1 | 1 |
| Max. Page Read Access Time | 20 µs | | | | 0 | 1 | 0 | | |
| | Non-standard value | | | | 1 | 1 | 1 | | |
| | RFU | | | | All Other Combinations | | | | |
| $t_R$ (Max) | | | | | | | | | |
| Page Read Command Function | Inverting Page Read | | | 0 | | | | | |
| | Non-inverting Page Read | | | 1 | | | | | |
| VPP not used | | 0 | 0 | Internal voltages generated with Vcc | | | | | |
| VPP required | | 0 | 1 | Internal voltages generated with Vpp | | | | | |
| VPP optional | | 1 | 0 | Device can be configured to use either Vcc or Vpp to generate internal voltages | | | | | |
| RFU | | 1 | 1 | | | | | | |

Figure 4:
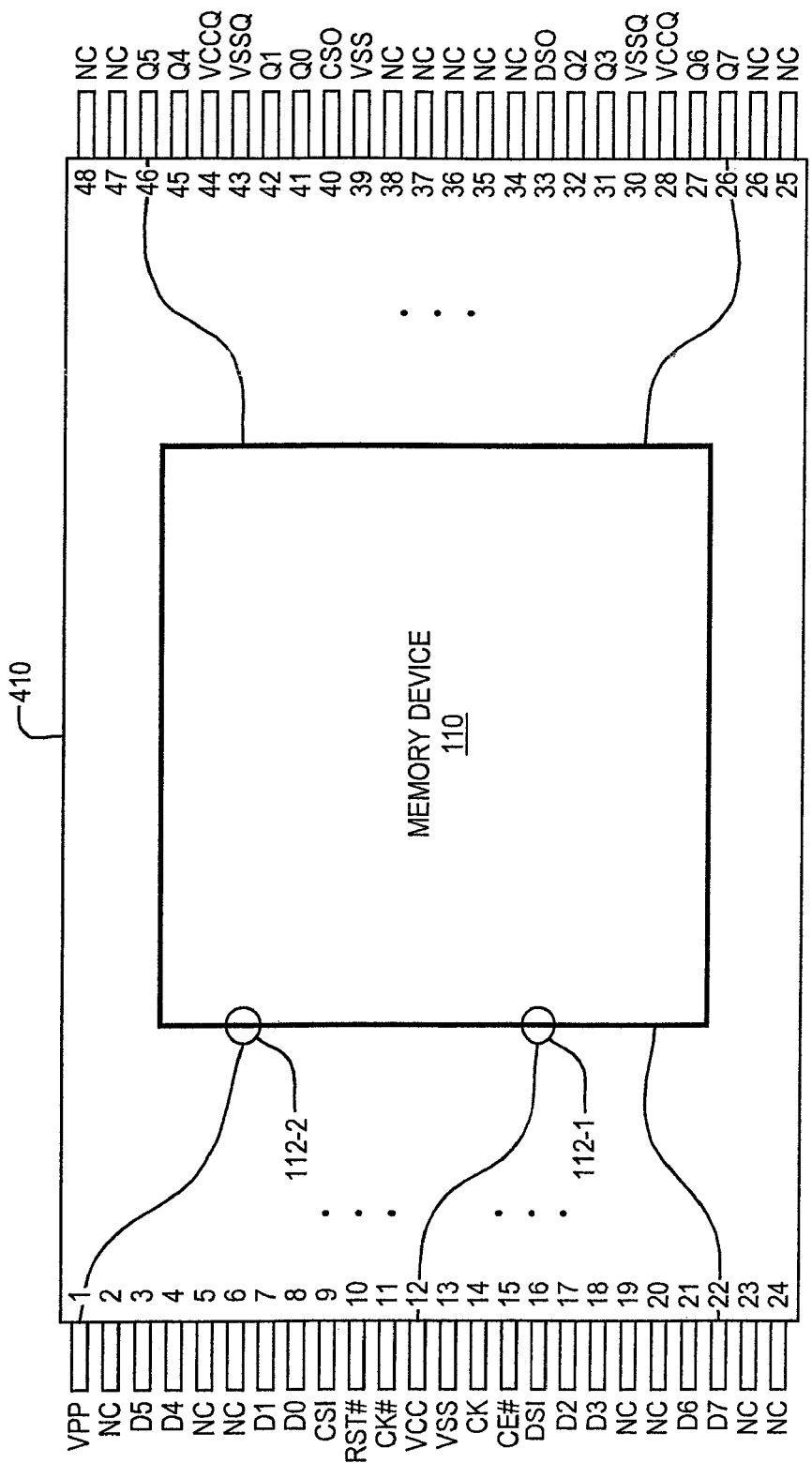
FIG. 4 is an example diagram illustrating a memory device and corresponding example package according to embodiments herein.

FIG. 4 is an example diagram illustrating a sample package form factor associated with memory device 110 according to embodiments herein. For clarity sake, the vertical sequences of dots represent connections from the pins to the memory device 410.

As shown, package 410 can be embodied as, for example, a 48-pin TSOP1 type package (12 millimeter×20 millimeter). Pin 1 of package 410 is dedicated for receiving input voltage Vpp conveyed to input 112-2 of memory device 110. Pin 12 of package 410 is dedicated for receiving voltage Vcc conveyed to input 112-1 of memory device 110. Pin 13 is to be attached to a corresponding ground voltage (e.g., input 112-3).

Pins 28 and 44 are examples of additional inputs for separately powering portions of I/O logic 138 as previously discussed. Pins 30 and 43 are to be connected to ground associated with voltage Vccq.

Additional details associated with the package 410 in FIG. 4 can be found in U.S. provisional patent application Ser. No. 60/902,003.

Figure 5:
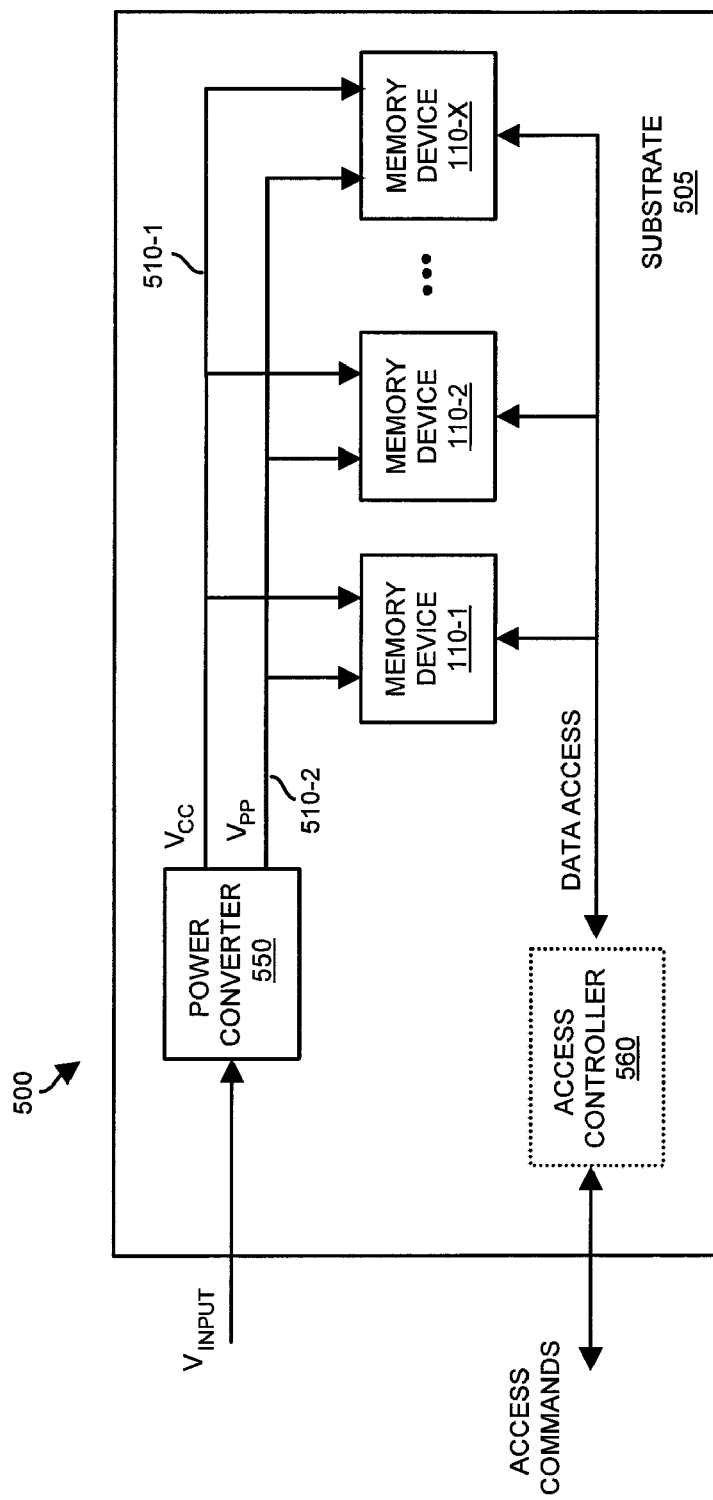
FIG. 5 is an example diagram of a memory system including one or more memory devices according to embodiments herein.

FIG. 5 is an example diagram of a memory system 500 including one or more memory devices 110 according to embodiments herein. As shown, memory system 500 includes a power converter circuitry 550 to receive voltage VINPUT supplied from a source such as, for example, a motherboard of a computer system, a 120 volt wall outlet, power associated with a USB connector. Based on $V_{INPUT}$t and possibly one or more other voltages input to power converter 550, power converter 550 generates one or more different voltages (e.g., Vcc and Vpp). The generated voltage Vcc and Vpp are applied to power one or more memory devices 110 (e.g., memory device 110-1, memory device 110-2, . . . memory device 110-X).

As an alternative to the embodiment above, note that voltage Vpp and voltage Vcc can be received from external sources without having to be converted by a power supply device present on substrate 505. Thus, power converter 550 is optional depending on availability of different power supply voltages Vcc and Vpp.

As previously discussed, each of the one or more memory devices in memory system 500 can include a respective flash memory 135 powered by voltage Vcc and a respective power management circuitry 120 to receive and convert voltage Vpp into at least one voltage used by the respective flash memory to carry out memory operations for management of data stored in the corresponding memory device.

The memory system 500 can include a substrate 505 (e.g., a circuit substrate, printed circuit board, flextape, multiple chips in a single package, etc.) on which the set of memory devices resides. Optional circuitry such as power converter 550 and access controller 560 can reside on substrate 505 as well or reside at one or more remote locations (e.g., on a motherboard, controller, etc.) with respect to the substrate 505.

To convey voltages Vcc and Vpp to memory devices, the substrate can include conductive paths 510. As shown, conductive path 510-1 conveys voltage Vcc to memory devices on substrate 505. Conductive path 510-2 conveys voltage Vpp to memory devices on substrate 505.

In accordance with the embodiments as previously discussed, each memory device on substrate 505 can include a corresponding first power input pin to deliver voltage Vcc to the flash memory of the respective memory device. Additionally, each memory device on the substrate 505 can include a corresponding second power input pin to deliver voltage Vpp to the power management circuitry of the respective memory device.

As previously discussed, the one or more internal voltages generated by the respective power management circuits enable functions such as: i) programming of cells in the respective flash memory, ii) erasing of cells in the respective flash memory, iii) reading data from cells in the respective flash memory.

Memory system 500 can be used in many different types of consumer and commercial applications. For example, in one embodiment, the memory system 500 is a thumb drive device such as a memory stick that plugs into a USB port of a computer. In such an instance, the USB port may provide a voltage such as Vpp that is downcoverted locally to Vcc. Both Vpp and locally generated Vcc in the thumb drive device are applied to a corresponding one or more memory devices in the thumb drive device (e.g., a so-called memory stick) to carry out functionality as described herein.

According to another embodiment, the memory system 500 can be a single or dual in-line memory board that removably connects to a motherboard.

According to another embodiment, the memory system 500 is a solid state internal memory drive associated with a computer system.

According to another embodiment, the memory system 500 is an external drive accessible by a computer system. Thus, memory system 500 can be configured in many different form factors depending on the application.

Figure 6:
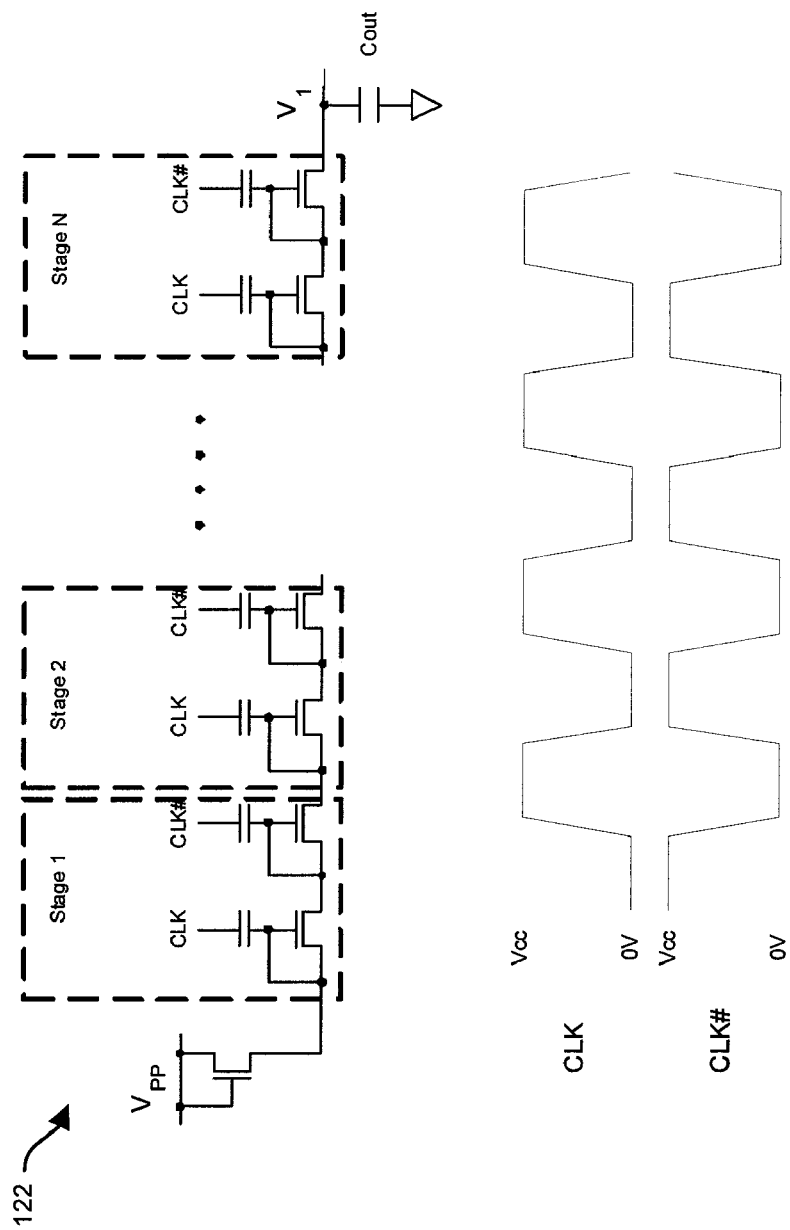
FIG. 6 is an example diagram illustrating voltage converter circuitry.

FIG. 6 is an example diagram illustrating voltage converter circuitry 122 for converting an input voltage such as Vpp or Vcc to one of internal voltages V1, V2, . . . , Vk according to embodiments herein. Power management circuitry 120 generates and applies signal CLK and CLK # to inputs of each charge pump stage (e.g., stage 1, stage 2, . . . , stage N). CLK and CLK # can be Vcc level signals as shown, or alternatively Vpp level signals for higher efficiency. Based on application of the clock signals and input voltage as shown, voltage converter circuitry 122 produces internal voltage V1. As previously discussed, the power management circuitry 120 can include multiple other voltage converter circuitry 122 (similar to that shown in FIG. 6) to produce other internal voltages V2, . . . , Vk.

More specifically, FIG. 6 includes an illustration of the typical voltage waveforms of an example N-stage multiplier (e.g., one of multiple voltage converters) and corresponding operation associated with one of multiple voltage converters. Note again that voltage converter circuitry 122 can be used in power management circuit 120 according to embodiments herein.

As shown in FIG. 6, the two clocks (namely, CLK and CLK #) are in anti-phase with amplitude Vcc, and are capacitively coupled to corresponding gates in the chain of switches. In the context of the present example, the voltage converter circuitry 122 (e.g., multiplier) operates in a manner similar to a bucket-brigade delay line, however, the voltages at nodes between switches in the chain of switches are not reset after each pumping cycle so that the average node voltage potentials (e.g., voltages of the nodes between one switch and the next in the chain of switches) increase progressively from the input to the output of the switch chain to produce voltage V1. This operation is similar in principle to the well-known "bootstrap" technique often used in MOS (Metal Oxide Semiconductor) integrated circuits to multiply voltages.

Note again that the voltage converter circuitry 122 as shown in FIG. 6 is shown by way of example only and that other converters circuits or circuitry can be used in power management circuitry 120 to convert an input voltage to an output voltage.

Figure 7:
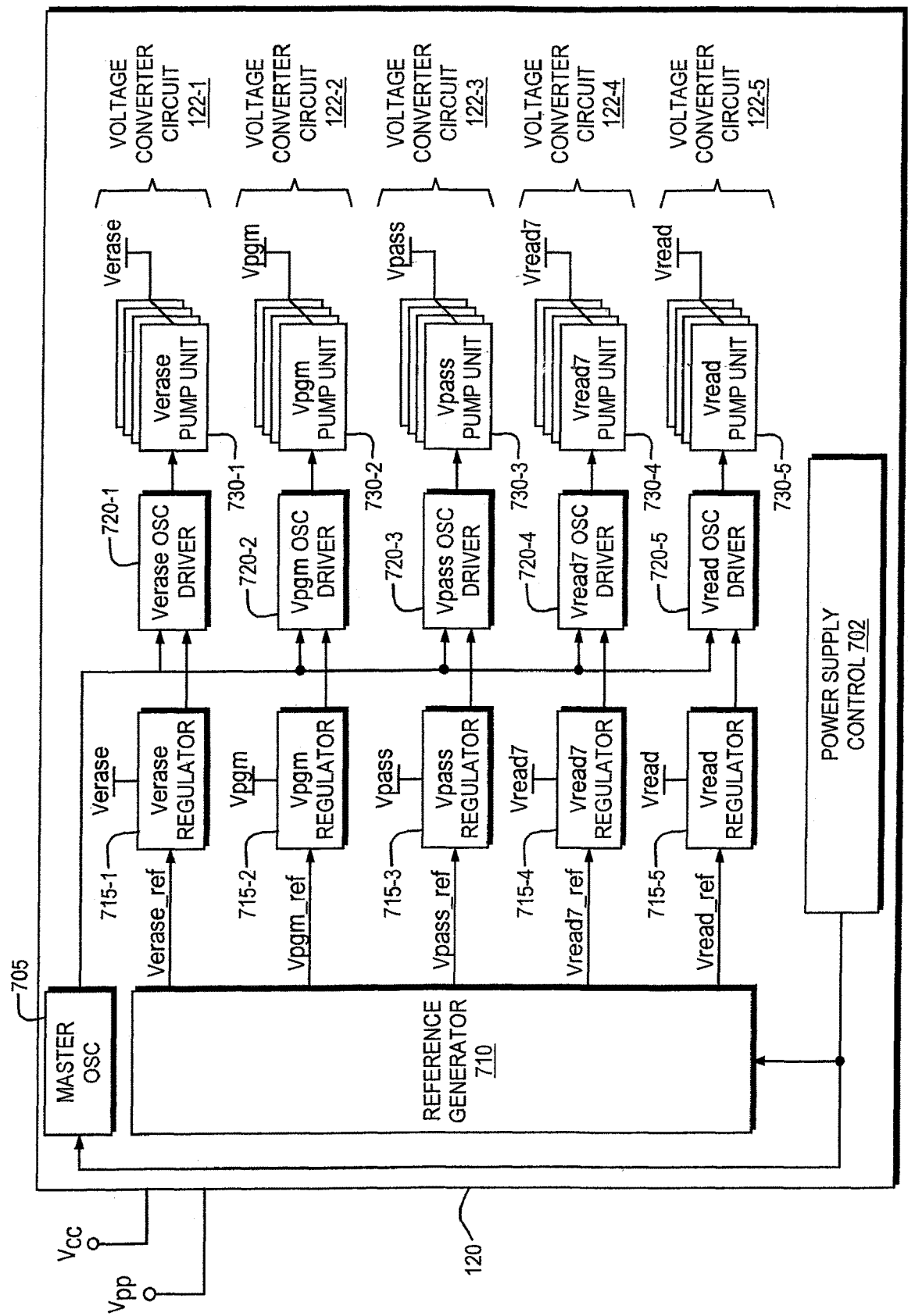
FIG. 7 is an example diagram illustrating power management circuitry according to embodiments herein.

FIG. 7 is an example diagram illustrating a power management circuitry 120 and related circuitry according to embodiments herein. As shown, power management circuitry 120 includes a power supply controller 702 to initiate operation of the different voltage converter circuits. Based on input from power supply controller 702, reference generator 710 produces different reference voltages for each converter 122. Master oscillator produces a clock signal.

Each of the regulators 715 (e.g., regulator 715-1, regulator 715-2, regulator 715-3, regulator 715-4, and regulator 715-5) receives a corresponding reference voltage depending on the corresponding voltage to be produced by the given voltage converter. For example, regulator 715-1 receives voltage reference Verase_ref, regulator 715-2, receives voltage reference Vprogram_ref, and so on. The voltage regulators 715 provide an indication to corresponding driver 720 whether the corresponding produced voltage is within regulation.

Each of drivers 720 (e.g., driver 720-1, driver 720-2, driver 720-3, driver 720-4, driver 720-5) outputs one or more control signals to corresponding charge pump units 730 depending on the master clock signal from oscillator 705 and the respective input control received from the corresponding regulator 715. Charge pump units 730 (e.g., charge pump 730-1, charge pump 730-2, charge pump 730-3, charge pump 730-4, and charge pump 730-5), in turn, produce the respective internal voltages V1, V2, ..., V5 used to support different memory operations.

Typically the flash memory cell (NAND flash or NOR flash) in memory 135 of memory device 110 is erased and programmed by either Fowler-Nordheim (F-N) tunneling or hot electron injection. Erase, program and read operations as well as use of internal voltages V1, V2, ..., Vk to carry out such operations at the cell level are shown in an example NAND flash memory embodiment in following FIGS. 8-11.

As will be discussed in more detail later in this specification, to carry out read and program verify operations associated with memory 135, the power management circuitry 120 can generate Vread and Vread7 voltages:

Vread (4.5V~5.5V, in some examples): wordline voltage to the unselected cell gate in the selected NAND string Vread7 (6~7V, in some examples): Vread pass voltage in the selected block decoder To carry out programming operations, the power management circuitry can generate Vpgm and Vpass:

Vpgm (14V~20V, in some examples): wordline voltage to the selected cell gate in the selected NAND string Vpass (8V~14V, in some examples): wordline voltage to the unselected cell gate in the selected NAND string To carry out erase operations, the power management circuitry can generate Verase:

Verase (~20V, in some examples): erase voltage to the cell substrate

As will be appreciated by those skilled in the art, the level of high voltages mentioned above may be varied by cell technology, device technology, and process technology.

Figure 8:
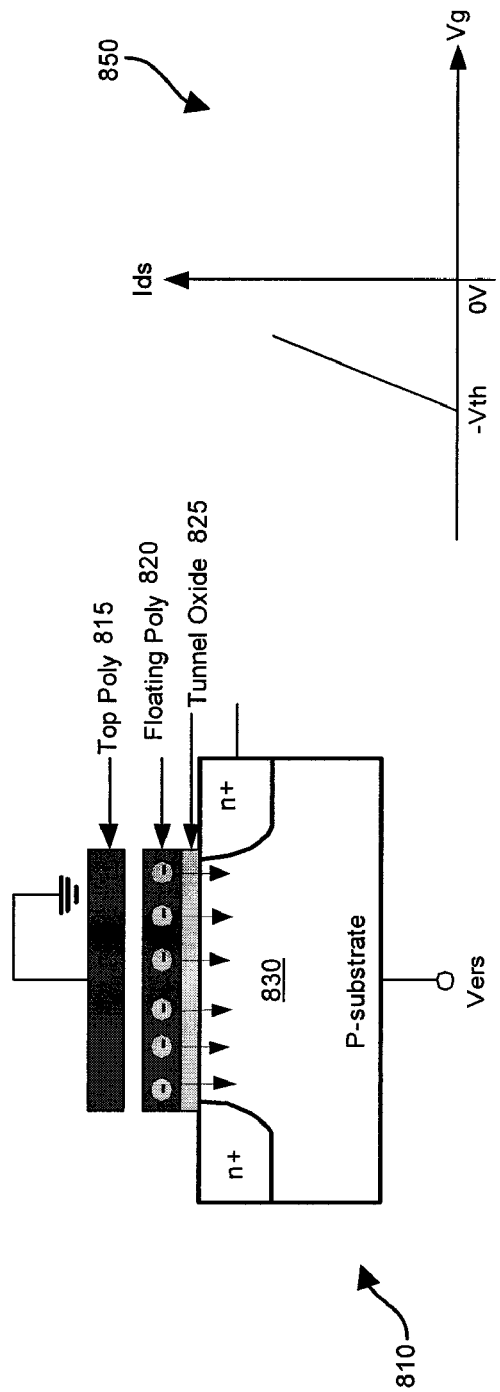
FIG. 8 is an example diagram illustrating an erase operation with respect to a memory cell.

FIG. 8 is an example diagram illustrating an erase operation with respect to a memory cell according to embodiments herein.

In a NAND flash memory embodiment, both erasing and programming of cells in memory 135 are governed by F-N tunneling. During an erase operation, a top poly 815 (i.e. top gate) of a corresponding cell 810 of memory 135 is biased to Vss (ground) while the substrate 830 of the cell 810 is biased to an erase voltage Vers (e.g., 20 volts) produced by power management circuitry 120. The source & drain of the cell 810 are floated (source and drain are automatically biased to Vers (e.g., Verase) due to junction-forward-bias from P-substrate 830 to n+ source/drain). Via this erase bias condition, trapped electrons (charge) in a floating poly 820 (i.e. floating gate) are emitted uniformly to the substrate 830 through the tunnel oxide 825 as shown.

The cell's Vth (e.g., voltage threshold) of the erased cell becomes negative as shown in graph 850 of FIG. 8. In other words, the erased cell is an ON-state transistor (normally turned on with gate bias Vg of 0V).

Figure 9:
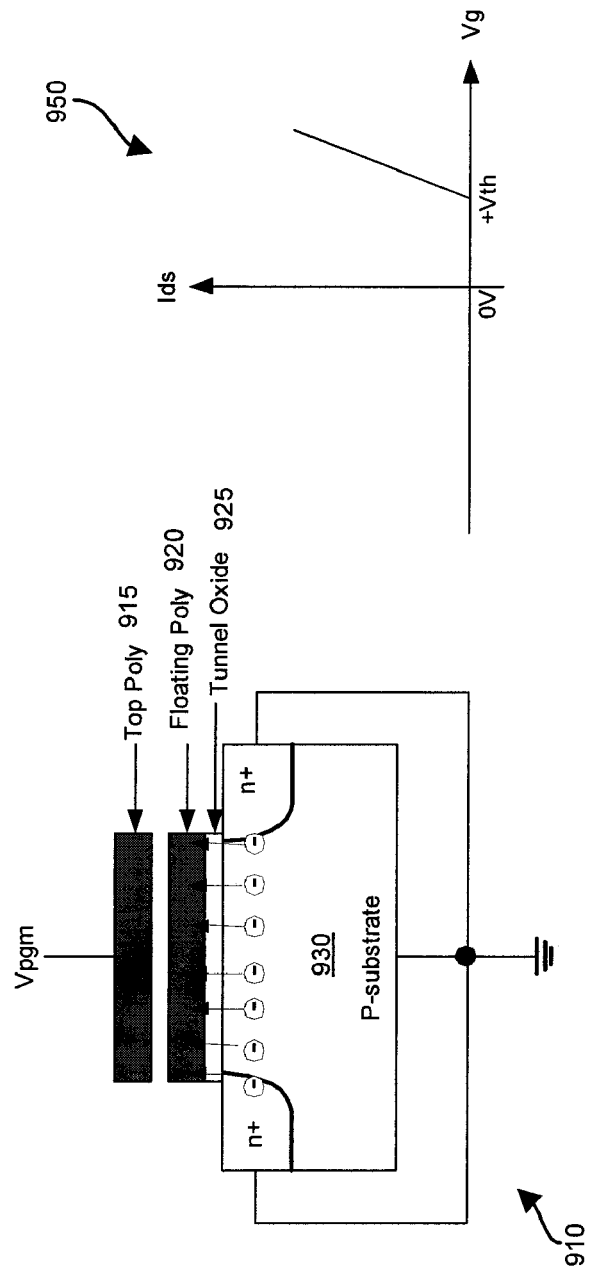
FIG. 9 is an example diagram illustrating a cell program operation.

FIG. 9 is an example diagram illustrating a cell program operation according to embodiments herein.

As shown, during a program operation, the top poly 915 (i.e. top gate) of the example cell 910 of memory 135 is biased to a program voltage Vpgm while the substrate 930, source and drain of the cell 910 are biased to Vss (ground). Via this program bias condition, electrons (charge) in the substrate 930 are uniformly injected to the floating poly 920 (i.e. floating gate) through the tunnel oxide 925. The voltage threshold of the programmed cell becomes positive as shown in graph 950 of FIG. 9. In other words, the programmed cell is an OFF-state transistor (normally turned off with gate bias Vg of 0V).

Figure 10:
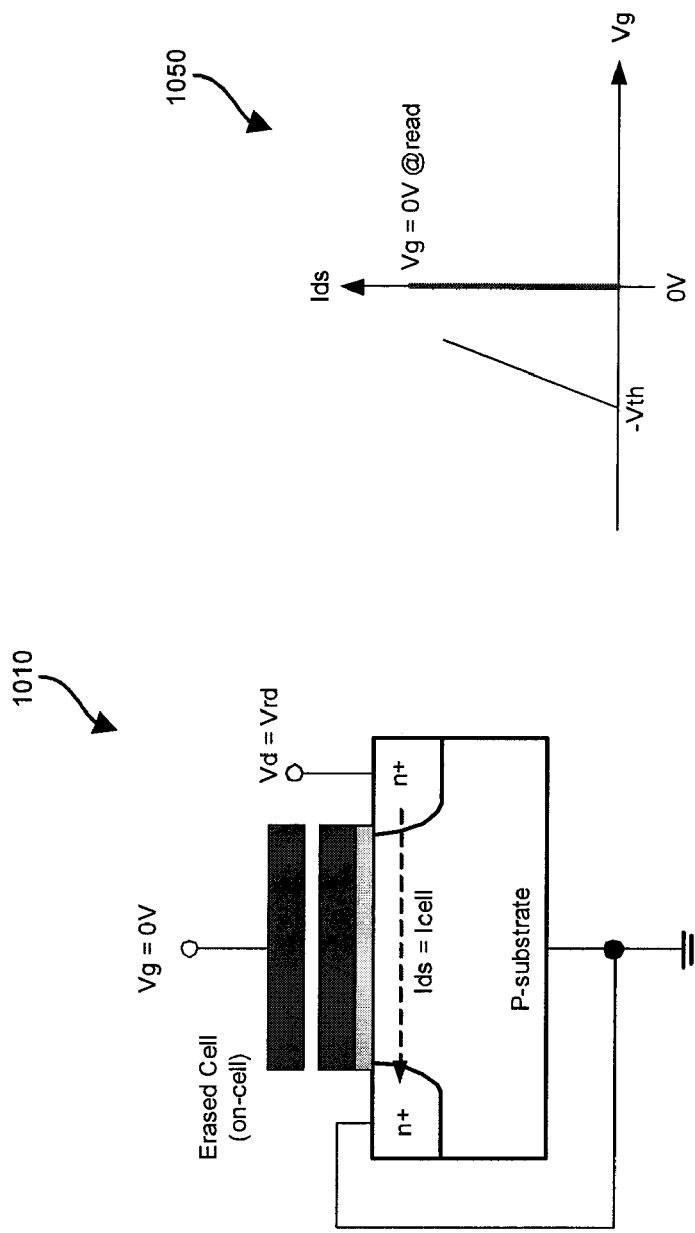
FIG. 10 is an example diagram illustrating reading of an erased cell.

FIG. 10 is an example diagram illustrating reading of an erased cell according to embodiments herein.

In order to read cell data of cells in memory 135, the corresponding gate and source of the selected cells (e.g., cell 1010) are biased to 0V.

If the cell 1010 such as the erased cell as shown in FIG. 10, the erased cell 810 has a negative threshold voltage (as shown in graph 1050) and thus the cell current (Icell) from the drain to the source exists under the given bias condition.

Figure 11:
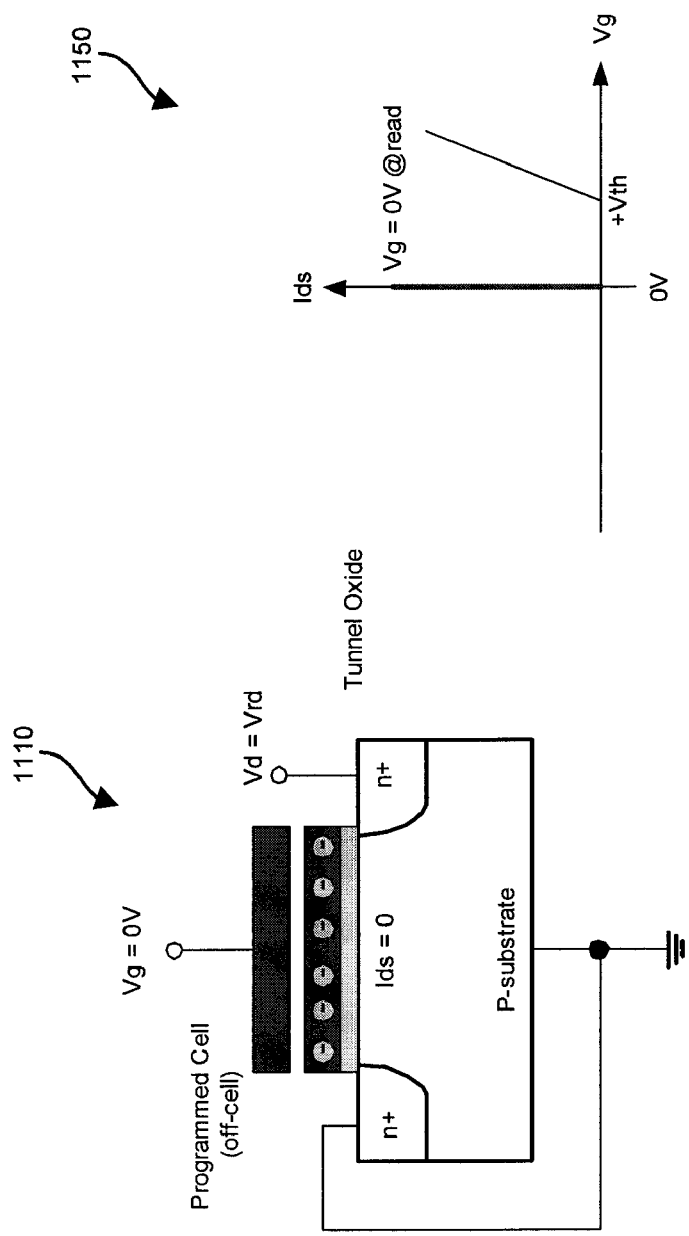
FIG. 11 is an example diagram illustrating reading of a programmed cell.

FIG. 11 is an example diagram illustrating reading of a programmed cell according to embodiments herein.

In order to read cell data of cells in memory 135 as discussed above, the corresponding gate and source of the selected cells (e.g., cell 1110) are biased to 0V.

If the cell 1110 is programmed as shown in FIG. 11, the programmed cell 1110 has a positive threshold voltage (as shown in graph 1150) and there is no cell current from the drain to the source exists under the given bias condition. A sense amplifier connected to each bitline senses and latches cell data; an erased cell (on-cell) such as cell 1010 in FIG. 10 is sensed as logic '1' and a programmed cell (off-cell) such as cell 1110 as in FIG. 11 is sensed as logic '0'.

Figure 12:
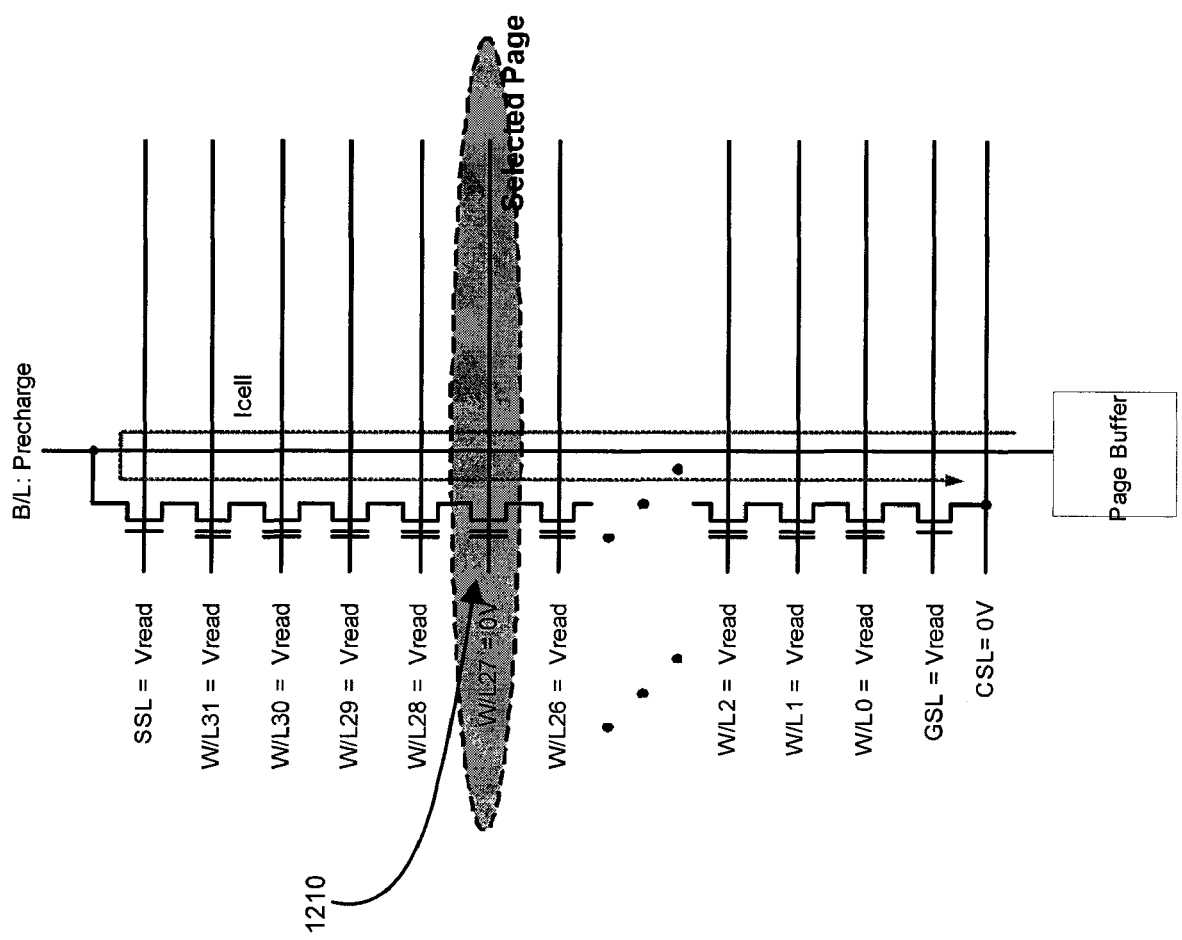
FIG. 12 is an example diagram illustrating a bias condition during a read page.

FIG. 12 is an example diagram of a NAND cell string illustrating bias conditions and use of an internal voltage (e.g., Vread) generated by power management circuitry 120 during a read page operation associated with memory device 110 according to embodiments herein.

A selected wordline (e.g., wordline 27) in memory 135 is set to 0V while unselected wordlines (e.g., wordlines 0-26, and 28-31), SSL, and GSL are biased to voltage Vread (e.g., 7 volts). Vread is generated by power management circuitry 120 and is sufficiently high to render unselected cell transistors (e.g., those on wordlines 0-26 and 28-31) conductive regardless of their programmed state (i.e. cell Vth). The common source line, CSL, is set to ground. With read bias conditions applied, the voltage threshold (e.g., Vth) of the selected cell determines the cell current, Icell. This cell current Icell is sensed by the bitline sense amplifier in a page buffer. Thus, the bitline sense amplifier is able to detect the state of cell 1210.

Figure 13:
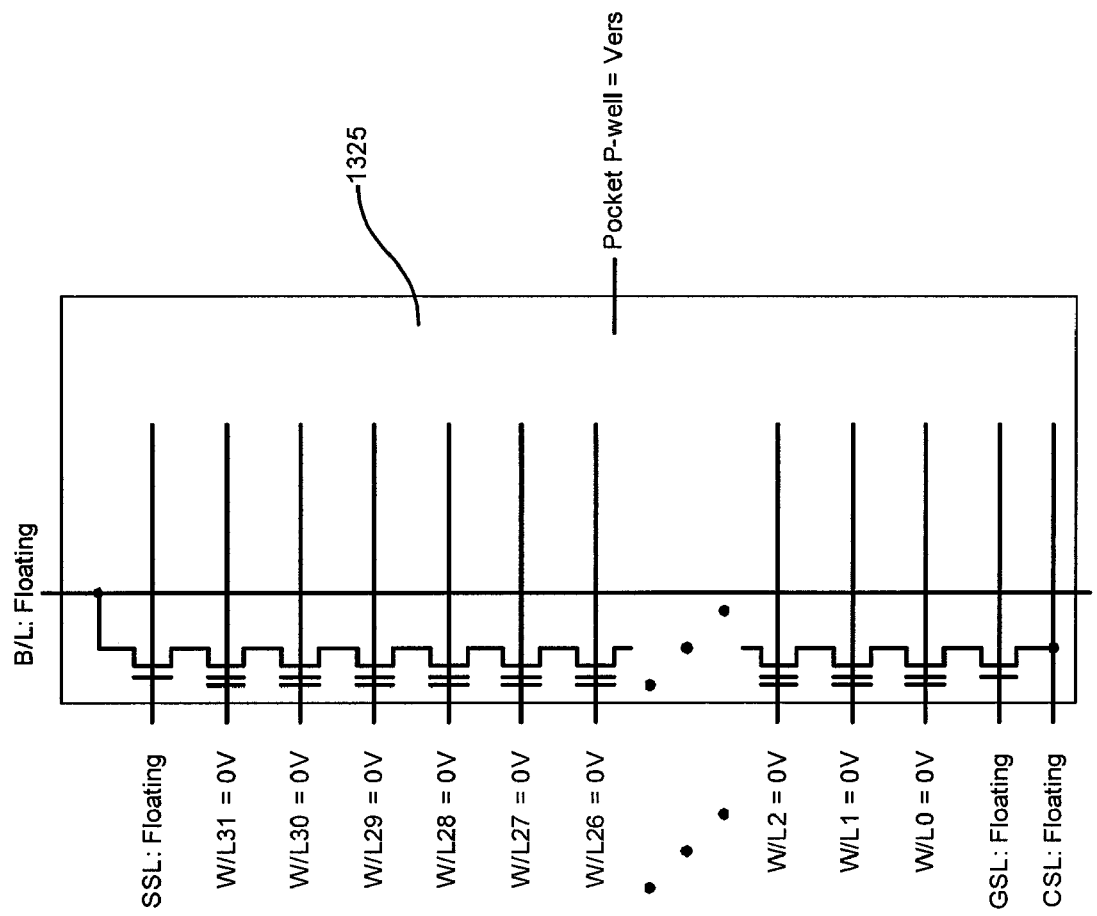
FIG. 13 is an example diagram illustrating a block erase operation.

FIG. 13 is an example diagram illustrating a block erase operation according to embodiments herein.

Flash memory cells in memory 135 must be erased prior to program. According to one embodiment, erase operations are performed on a block basis rather than on a cell by cell basis.

To carry out a block erase operation for the cells of memory 135 as shown in FIG. 13, the pocket p-well (PP-well) substrate 1325 is biased to an erase voltage, Vers produced by power management circuitry 120, while bitlines (B/Ls) and common source line (CSL) in the selected block are set to a floating state. At the same time while in the above state, all wordlines in the selected block are biased to 0V while the string select line (SSL) and the ground select line (GSL) are floated and boosted to the erase voltage Vers by capacitive decoupling that occurs between them (e.g., SSL and GSL) and the substrate 1325. Via this technique, the entire set of cells in a selected block can be erased by F-N tunneling.

Figure 14:
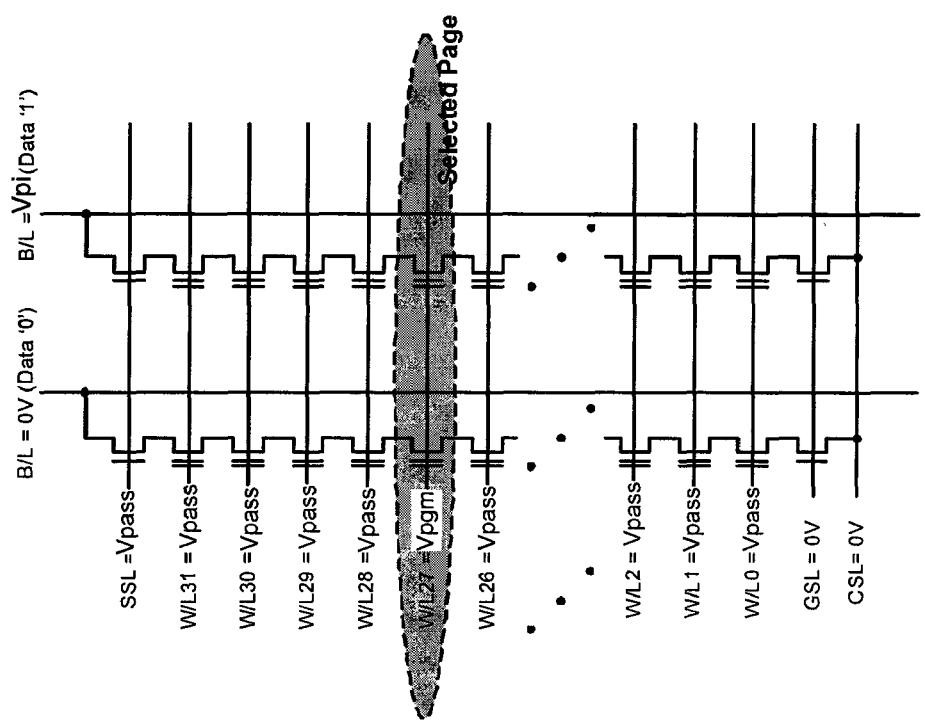
FIG. 14 is an example diagram illustrating a page program operation.

FIG. 14 is an example diagram illustrating a page program operation according to embodiments herein. Note that the selected page in the selected block must be erased prior to page program and the erased cell is read out as logic '1'.

The following voltage generated by power management circuitry 120 are used to carry out a page program operation as discussed below: Vpgm, Vpass, and Vpi.

Vpgm (e.g., ~18V in the context of the present example) for programming is set to a sufficiently high program voltage to cause F-N tunneling with drain voltage of 0V on the selected cell.

Vpass (e.g., ~10V in the context of the present example) for 'passing' Vpi is set to set to sufficiently high pass voltage to render unselected cell transistors in the selected string conductive regardless of their programmed state (i.e. Cell Vth). At the same time, the Vpass should be sufficiently low so as not to cause F-N tunneling on unselected cells Vpi: (e.g., ~8V in the context of the present example) to inhibit programming is to set to sufficiently high program inhibit voltage to prevent F-N tunneling on the selected cell. Typically Vpi is higher than supply voltage Vcc and lower than Vpass In case of logic '0' program, the selected bitline is set to 0V and the channel of the selected cell is grounded. The gate of the selected cell is biased to the first voltage Vpgm. Thus the selected cell is programmed by electron injection (F-N tunneling) from the drain to the floating gate.

In case of logic '1' program, the erased cell prior to program must retain the cell state (i.e. erased cell's threshold voltage, Vth). In other words, cell programming is prevented. To prevent cell programming, the selected cell bitline is set to Vpi and the Vpi level is transferred to the drain of the selected cell through unselected cells. A voltage difference (Vpgm−Vpi) on the selected cell prevents F-N tunneling from the drain to the floating gate.

In the previous example, a high program inhibit voltage Vpi was supplied to the NAND string channel directly through bitlines. In the worst case, all of the bitlines corresponding to the entire selected page are set to Vpi (i.e., the case where all the cells on the selected page are programmed to logic '1'), which creates the following problems:

Vpi is provided by an internal high voltage generator during program operations and a large capacity charge pump is required to supply Vpi to the highly capacitive bitlines. This leads to a drastic increase in the power consumption and the chip size.

Page buffers connected to bitlines must be provided with high voltage transistors in order to provide Vpi. High voltage transistors are bigger than regular voltage (i.e. Vcc) transistors, which increase the page buffer size (and consequently the chip size).

Further scaling down of the memory is burdened by the high voltage bitline isolation requirements.

Program speed is slower due to charging highly capacitive bitlines to Vpi by a built-in voltage generator having a limited current supply.

Figure 15:
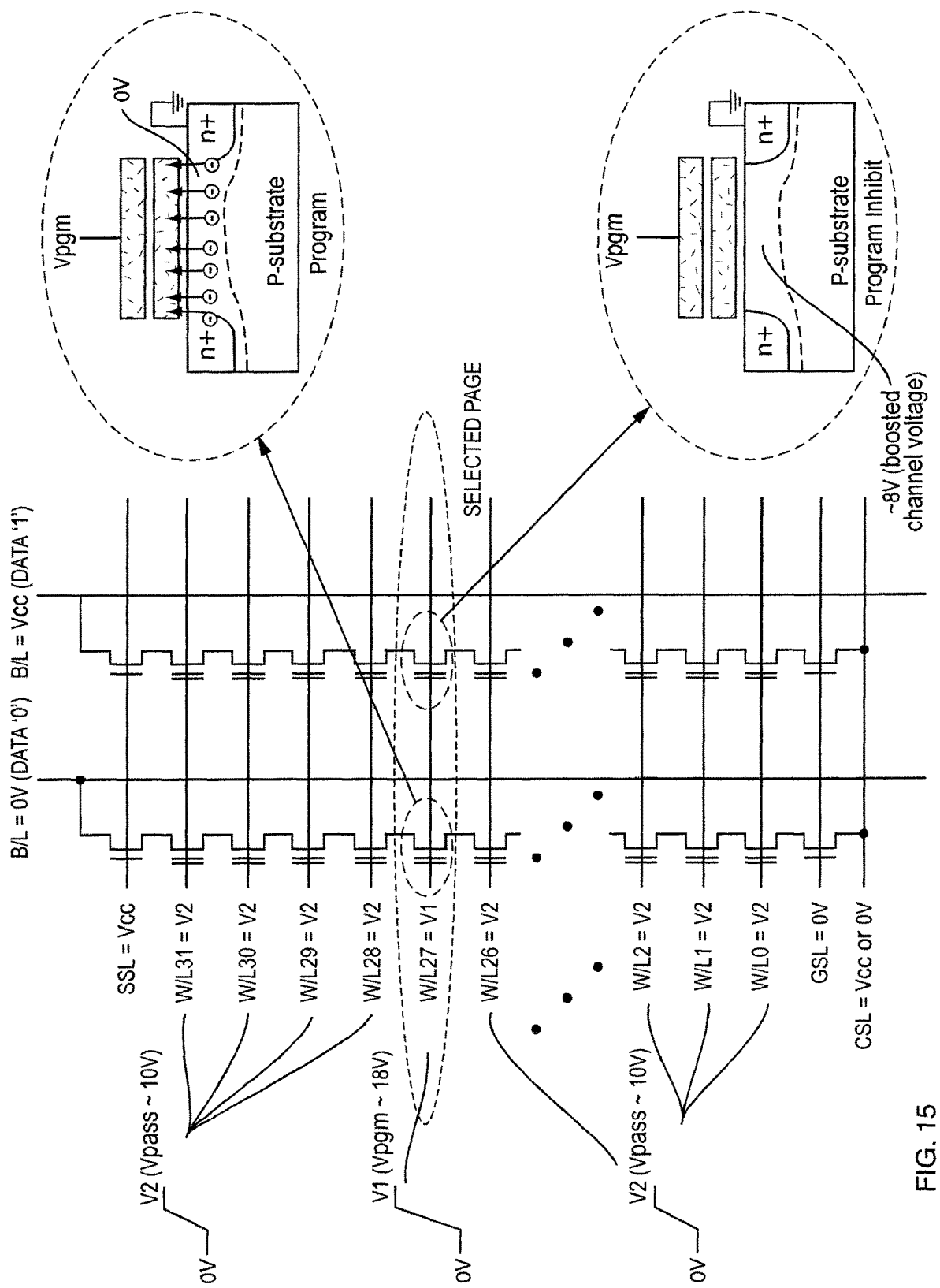
FIG. 15 is an example diagram illustrating page program bias conditions.

FIG. 15 is an example diagram illustrating page program bias conditions according to embodiments herein.

In order to resolve problems described in FIG. 14, a self-boosting program inhibit scheme shown in FIG. 15 can be used.

With the SSL transistors turned on and the GSL transistors turned off, the bitline voltages for cells to be programmed are set to 0 V, while the bitline voltages for cells to be program inhibited are set to Vcc. A 0 V bitline ties the channel of the associated unit NAND string to ground. When the program voltage, Vpgm, is applied to the gate of the selected cell, the large potential difference between gate and channel results in F-N tunneling of electrons on to the floating gate, programming the cell.

In program inhibited cells (e.g., cells in which Vcc is applied to the respective bitline), the bitline initially precharges the associated channels. When the wordline voltages of the unit NAND string rise to the program voltage Vpgm at the selected wordline and to the pass voltage, Vpass, at the unselected wordlines, the series capacitances through the control gate, floating gate, channel, and bulk are coupled and the channel potential is boosted automatically.

In program inhibited strings, as the coupled channel voltage rises to [Vcc-Vth] (Vth: threshold voltage of the SSL transistor), the SSL transistor shuts off and the channel becomes a floating node. The floating channel voltage can rises to approximately 80% of the gate voltage. Thus, channel voltages of program inhibited cells are boosted to approximately 8 V in the context of the present example when program voltage Vpgm (e.g., 15.5-20 volts in the context of the present example) and pass voltage (Vpass such as 10 V in the context of the present example) are applied to the control gates. This high channel voltage prevents F-N tunneling from occurring in the program inhibited cells. Using this technique, all disadvantages caused by the requirement of applying a higher voltage Vpi (~8V in the context of the present example) to bitlines can be eliminated.

Figure 16:
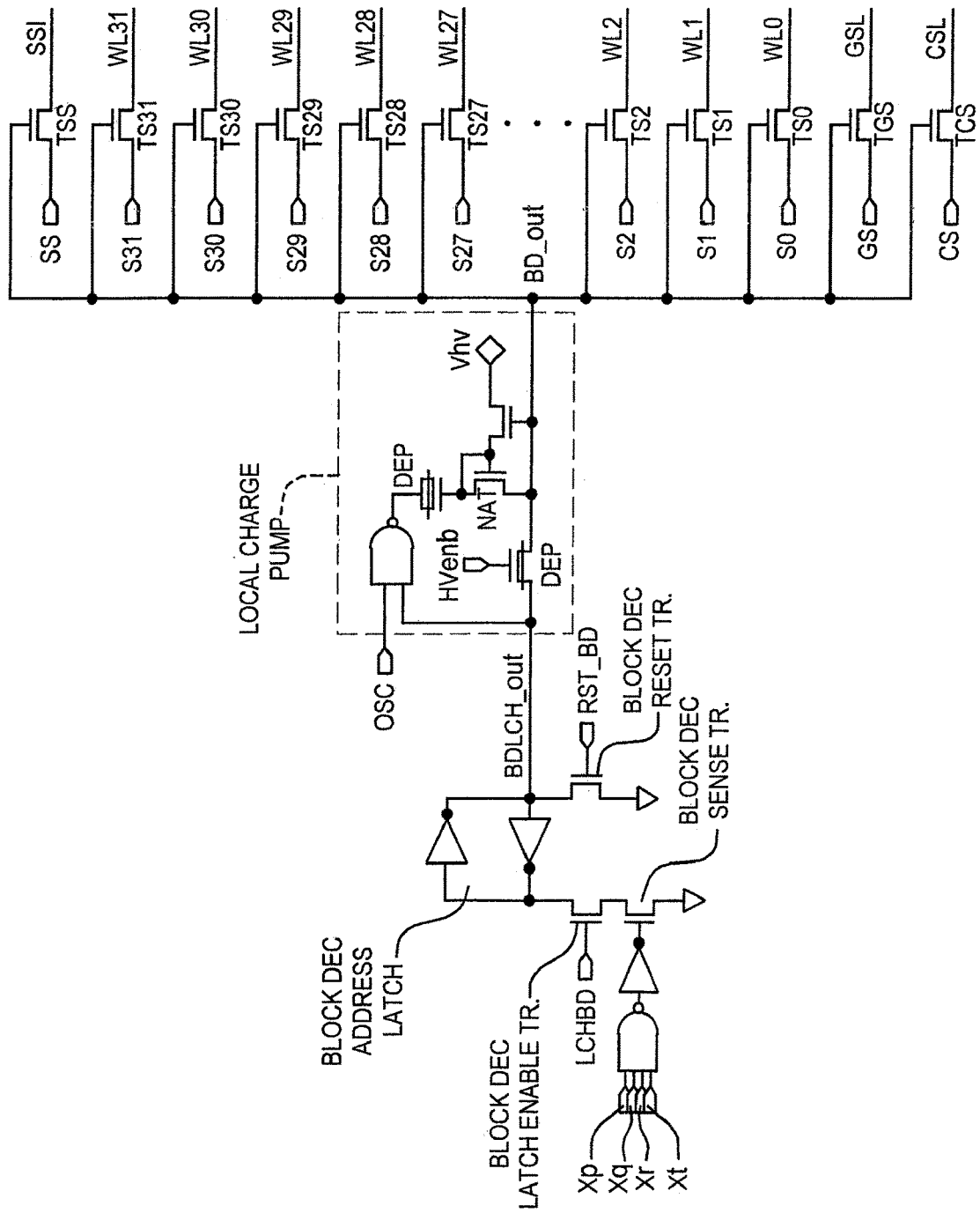
FIG. 16 is an example diagram illustrating a block decoder.

FIG. 16 is an example diagram illustrating a block decoder according to embodiments herein. Note that there are many variations on circuit implementation for the block decoder.

String select line SSL, wordlines WL0 to WL31, ground select line GSL and common source line CSL are driven by common signals of SS, S0 to S31, GS and CS through pass transistors TSS, TS0 to TS31, TGS and TCS which are commonly controlled by the output signal BD_out of the block decoder.

The local charge pump is a high voltage switching circuit to control pass transistors TSS, TS0 to TS31, TGS and TCS. It typically consists of enhancement NMOS transistor, depletion NMOS transistor (DEP), native NMOS transistor (NAT) and a 2-input NAND gate. The output signal BD_out of the block decoder is raised to Vhv when the block decoder latch output BDLCH_out is Vdd, HVenb is 0V and the input OSC is oscillating (note: the local charge pump is a well known circuit technique).

Latch output BDLCH_out is reset to 0V when input RST_BD is pulsed high (short pulse) and the decoded address is latched when input LCHBD is pulsed high (short pulse) with valid row predecoded address signals of Xp, Xq, Xr and Xt.

Figure 17:
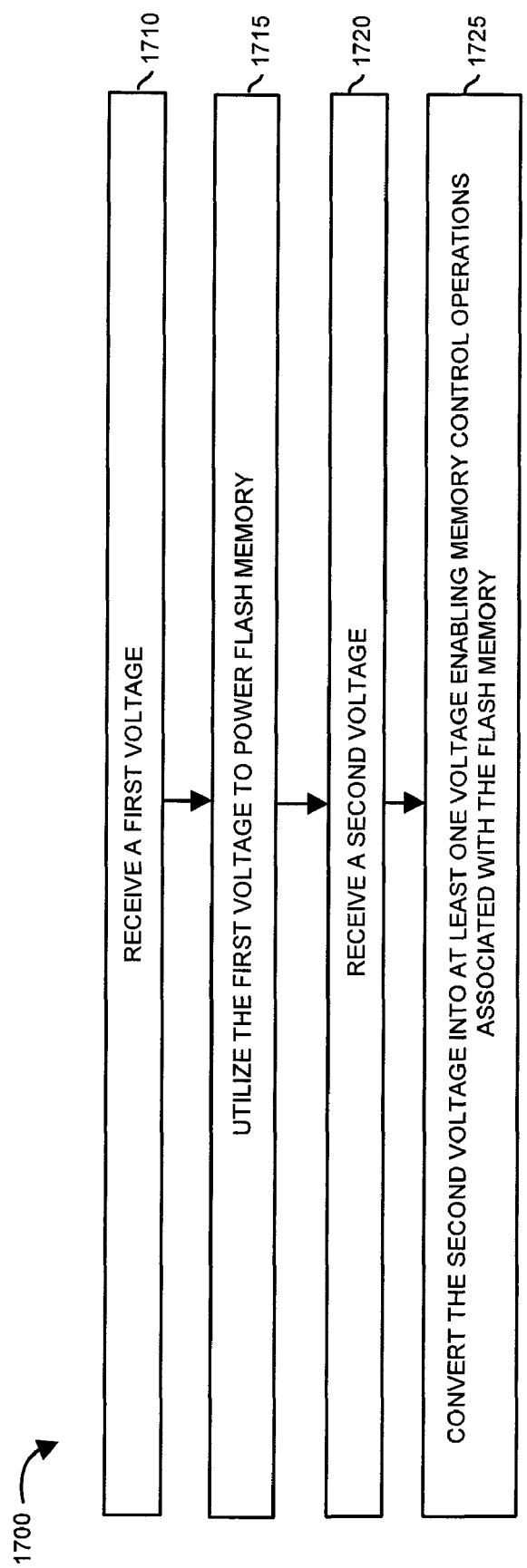
FIGS. 17-19 are example methods associated with one or more memory devices and/or memory systems according to embodiments herein.

FIG. 17 is an example flowchart 1700 illustrating a method associated with a memory device 110 according to embodiments herein. In general, flowchart 1700 captures some of the concepts as discussed above. Note that an ordering of the steps in all of the flowcharts is by way of example only and that steps generally can be performed in any order. For example, there is no reason that step 1710 below must precede step 1715, and so on.

In step 1710, the memory device 110 receives voltage Vcc.

In step 1725, the memory device 110 converts voltage Vpp into one or more internal voltages V1, V2, . . . , Vk that enable memory control operations associated with the flash memory 135.

Figure 18:
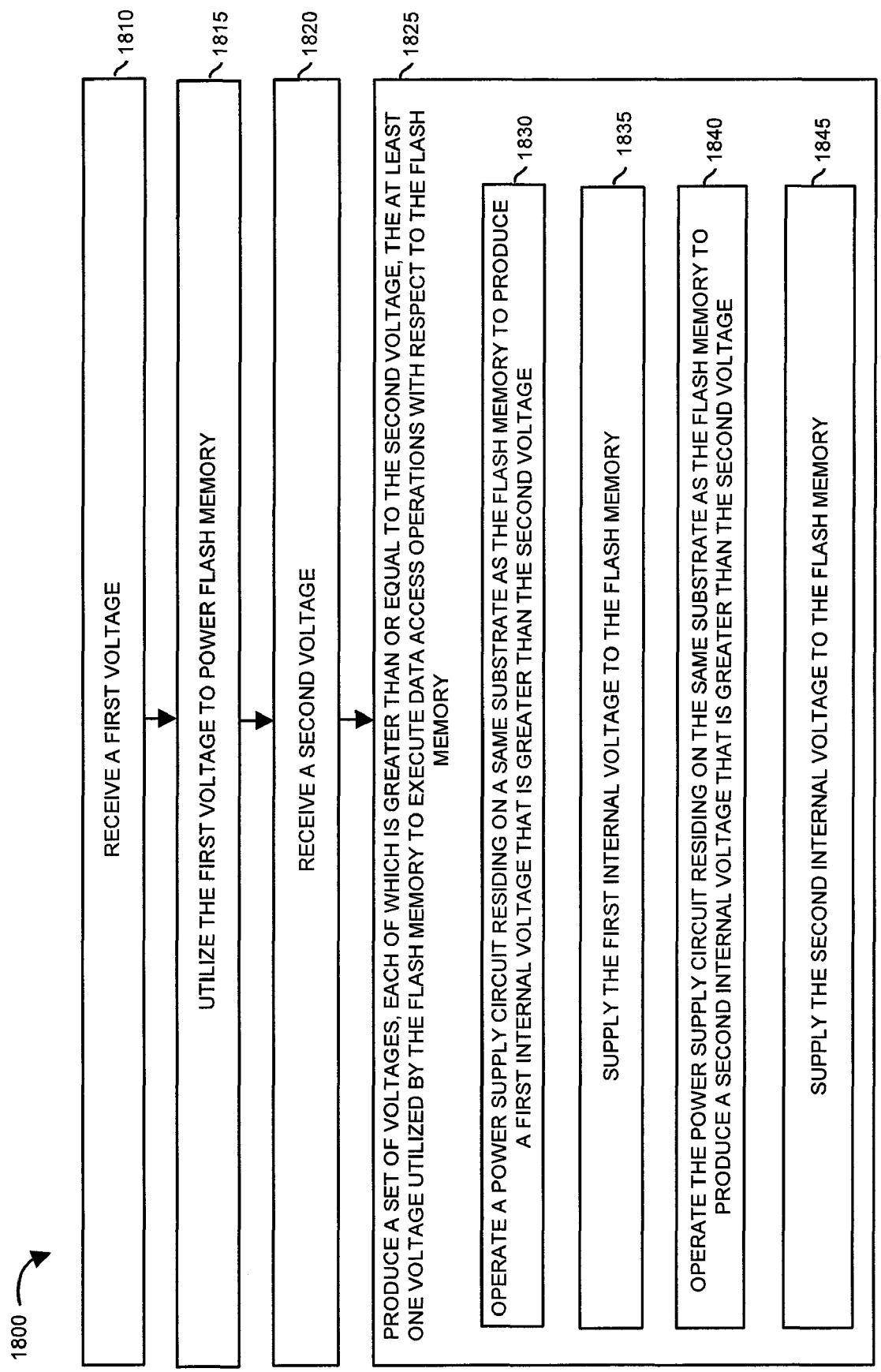

FIG. 18 is an example flowchart 1800 illustrating a method associated with a memory device 110 according to embodiments herein. In general, flowchart 1800 captures some of the concepts as discussed above.

In step 1810, the memory device 110 receives voltage Vcc.

In step 1815, the memory device 110 utilizes voltage Vcc to power memory 135.

In step 1820, the memory device 110 receives voltage Vpp.

In step 1825, the memory device 110 produces a set of internal voltages V1, V2, . . . , Vk, each of which is greater than or equal to voltage Vpp. As previously discussed, the internal voltages are utilized by the memory 135 to carry out different data access operations. To produce the internal voltages V1, V2, . . . , Vk, the power management circuit of memory device 110 performs the following sub-steps.

In sub-step 1830, the power management circuitry 120 of memory device 110 operates power supply circuitry (e.g., voltage converter circuitry 122) residing on a same substrate as the flash memory 135 to produce a first internal voltage (e.g., Verase) that is greater than Vpp.

In sub-step 1835, the power management circuitry 120 of memory device 110 supplies or conveys the first internal voltage to memory 135.

In sub-step 1840, the power management circuitry 120 of memory device 110 operates voltage converter circuitry 122 residing on the same substrate as the flash memory 135 to produce a second internal voltage that is greater than Vpp.

In sub-step 1845, the memory device 110 supplies the second internal voltage (e.g., Vprogram) to memory 135.

Figure 19:
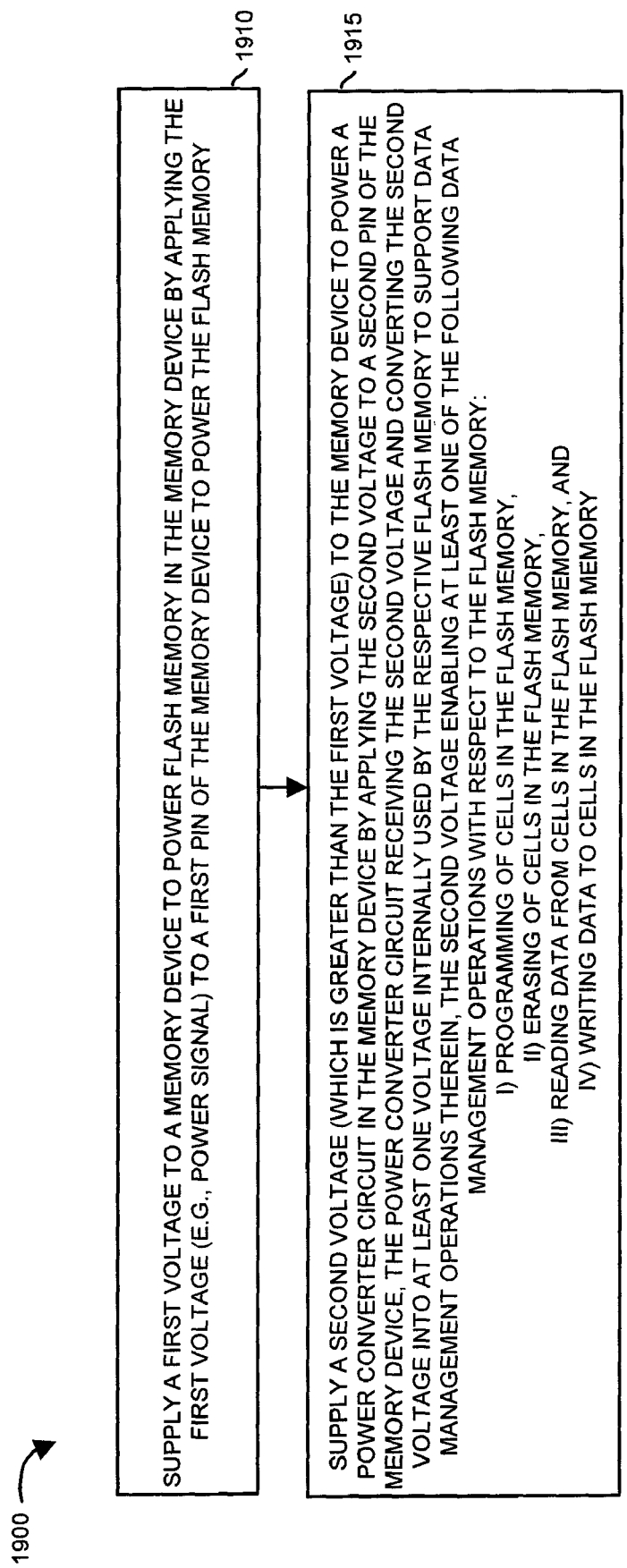

FIG. 19 is an example flowchart 1900 associated with a memory system 500 according to embodiments herein.

In step 1910, the user, manufacturer, operator, owner of memory device 110 supplies a voltage Vcc to memory device 110 to power flash memory in the memory device 110. In one embodiment, this includes applying Vcc to a first pin of the memory device to power the flash memory and/or related circuits.

In step 1915, the user, manufacturer, operator, owner of memory device 110 supplies voltage Vpp to the memory device 110 to power a power converter circuit in the memory device 110. In one embodiment, supplying voltage Vpp includes applying Vpp to a second pin of the memory device 110. As discussed, the power management circuitry (e.g., power converter circuitry) receives Vpp and converts Vpp into one or more internal voltages V1, V2, . . . , Vk, which are used by the respective flash memory 135 to support data management operations. For example, applying voltage Vpp enables one or more of the following selected data management operations: i) programming of cells in the flash memory, ii) erasing of cells in the flash memory, iii) reading data from cells in the flash memory.

Certain adaptations and modifications of the described embodiments can be made. Therefore, the above discussed embodiments are considered to be illustrative and not restrictive.

The invention claimed is:

1. A NAND flash memory device comprising:
   an array of NAND flash memory cells arranged in rows and columns, wherein each NAND flash memory cell of each row is coupled to a wordline, and each column comprises a string of series coupled NAND flash memory cells and one end of the string is coupled to a bitline;
   input/output logic configured to enable access to the data in the array of NAND flash memory cells;
   a first power input configured to receive an external Vcc power supply voltage;
   a second power input configured to receive an external Vpp power supply voltage, the external Vpp power supply voltage being optional and greater than the external Vcc power supply voltage;
   a third power input configured to receive an external Vccq power supply voltage, the external Vccq power supply voltage powering the input/output logic;
   a device information register configured to indicate whether the NAND flash memory device supports the external Vpp power supply voltage;
   a device control register configured to be set for enabling the external Vpp power supply voltage when a configuration command is received from a memory controller; and
   power management circuitry configured to generate a plurality of internal voltages by utilizing the external Vpp power supply voltage when the external Vpp power supply voltage is enabled by the device control register, and generate the plurality of internal voltages without the external Vpp power supply voltage when the external Vpp power supply voltage is not enabled by the device control register, each of the plurality of internal voltages being greater than the external Vpp power supply voltage, and the plurality of internal voltages being applied to a selected wordline during a page program operation for programming the data to selected row of NAND flash memory cells coupled to the selected wordline.

2. The NAND flash memory device as in claim 1, wherein the selected row of NAND flash memory cells comprises a program cell coupled to a first bitline and a program inhibit cell coupled to a second bitline, the first bitline biased to a ground voltage and the second bitline biased to the external Vcc power supply voltage.

3. The NAND flash memory device as in claim 2, wherein the program inhibit cell is biased to a self-boosted channel voltage.

4. The NAND flash memory device as in claim 1, wherein the device control register comprises a plurality of bits.

5. The NAND flash memory device as in claim 4, wherein a single bit of the device control register is used for enabling the external Vpp power supply voltage.

6. The NAND flash memory device as in claim 1, wherein the device information register comprises a plurality of bits.

7. The NAND flash memory device as in claim 6, wherein a single bit of the device information register is used for indicating whether the NAND flash memory device supports the external Vpp power supply voltage.

8. The NAND flash memory device as in claim 1 further comprising switch circuitry configured to select between inputting the external Vcc power supply voltage and the external Vpp power supply voltage into the power management circuitry to generate the plurality of internal voltages.

9. The NAND flash memory device as in claim 1, wherein the external Vcc power supply voltage is 3.3V and the external Vpp power supply voltage is 12V.

10. The NAND flash memory device as in claim 1 further comprising:
 a substrate comprising:
  a first conductive path for conveying the external Vcc power supply voltage from the first power input to the power management circuitry,
  a second conductive path for conveying the external Vpp power supply voltage from the second power input to the power management circuitry, and
  multiple conductive paths for conveying the plurality of internal voltages from the power management circuitry to the array of NAND flash memory cells.

11. The NAND flash memory device as in claim 1, wherein the device information register is further configured to indicate a cell type of the NAND flash memory cells as one of 2 level cell, 4 level cell, 8 level cell, and 16 level cell.

12. The NAND flash memory device as in claim 1, wherein the device information register is further configured to indicate a maximum page read access time (tR).

13. The NAND flash memory device as in claim 1, wherein the device information register is further configured to indicate a page read command function as being one of an inverting page read and a non-inverting page read.

\* \* \* \* \*